United States Patent
Vepa et al.

(10) Patent No.: US 7,657,390 B2
(45) Date of Patent: Feb. 2, 2010

(54) RECLAIMING SUBSTRATES HAVING DEFECTS AND CONTAMINANTS

(75) Inventors: Krishna Vepa, Danville, CA (US); Yashraj Bhatnagar, Santa Clara, CA (US); Ronald Rayandayan, Union City, CA (US); Hong Wang, Cupertino, CA (US)

(73) Assignee: Applied Materials, Inc., Santa Clara, CA (US)

( * ) Notice: Subject to any disclaimer, the term of this patent is extended or adjusted under 35 U.S.C. 154(b) by 553 days.

(21) Appl. No.: 11/265,237

(22) Filed: Nov. 2, 2005

(65) Prior Publication Data

US 2007/0099310 A1     May 3, 2007

(51) Int. Cl.
   *G06F 19/00*     (2006.01)
(52) U.S. Cl. .................. 702/108; 438/16; 700/121
(58) Field of Classification Search .................. 700/98, 700/121, 182, 108; 438/4, 78, 482, 585, 438/16; 257/617; 134/2; 118/723 R; 702/108, 702/116, 194, 19; 451/103, 14, 4
See application file for complete search history.

(56) References Cited

U.S. PATENT DOCUMENTS

| | | | |
|---|---|---|---|
| 3,583,561 A | | 6/1971 | Wiesler et al. |
| 3,929,529 A | | 12/1975 | Poponiak |
| 4,510,673 A | | 4/1985 | Shils et al. |
| 4,637,123 A | | 1/1987 | Cazcarra et al. |
| 5,100,501 A | | 3/1992 | Blumenthal |
| 5,210,041 A | * | 5/1993 | Kobayashi et al. .............. 438/7 |
| 5,272,119 A | | 12/1993 | Falster |
| 5,426,061 A | | 6/1995 | Sopori |
| 5,432,702 A | | 7/1995 | Barnett |
| 5,502,331 A | * | 3/1996 | Inoue et al. .................. 257/617 |
| 5,578,131 A | * | 11/1996 | Ye et al. .................. 118/723 R |
| 5,622,565 A | * | 4/1997 | Ye et al. .................. 118/723 R |
| 5,654,204 A | | 8/1997 | Anderson |
| 5,751,581 A | | 5/1998 | Tau et al. |
| 5,805,472 A | | 9/1998 | Fukasawa |
| 5,840,590 A | | 11/1998 | Myers et al. |
| 5,889,674 A | | 3/1999 | Burdick et al. |
| 5,949,584 A | | 9/1999 | White et al. |
| 5,966,459 A | | 10/1999 | Chen et al. |

(Continued)

FOREIGN PATENT DOCUMENTS

EP     0 690 482 A2     1/1996

(Continued)

OTHER PUBLICATIONS

Hua et al., Studies on Stacking Faults & Crystalline Defects in FabricationSilicon Wafer Substrate, 1998, Chartered Semiconductor Manufacturing Ltd., p. 1-8.*

*Primary Examiner*—Kidest Bahta
(74) *Attorney, Agent, or Firm*—Janah & Associates, P.C.

(57) ABSTRACT

Test substrates used to test semiconductor fabrication tools are reclaimed by reading from a database the process steps performed on each test substrate and selecting a reclamation process from a plurality of reclamation processes. The reclamation process can include crystal lattice defect or metallic contaminant reduction treatments for reclaiming each test substrate. Each test substrate is sorted and placed into a group of test substrates having a common defect or contaminant reduction treatment assigned to the test substrates of the group. Additional features are described and claimed.

34 Claims, 12 Drawing Sheets

U.S. PATENT DOCUMENTS

| | | |
|---|---|---|
| 5,999,003 A | 12/1999 | Steffan et al. |
| 6,020,639 A | 2/2000 | Ulrich et al. |
| 6,054,373 A | 4/2000 | Hiroshi et al. |
| 6,127,282 A | 10/2000 | Lopatin |
| 6,203,617 B1 | 3/2001 | Tanoue et al. |
| 6,265,683 B1 | 7/2001 | Flottmann et al. |
| 6,265,684 B1 | 7/2001 | Wu |
| 6,303,398 B1 | 10/2001 | Goerigk |
| 6,303,472 B1 * | 10/2001 | Queirolo et al. ............. 438/482 |
| 6,305,548 B1 | 10/2001 | Sato et al. |
| 6,363,382 B1 | 3/2002 | Kotani et al. |
| 6,408,219 B2 | 6/2002 | Lamey et al. |
| 6,427,092 B1 | 7/2002 | Jones et al. |
| 6,431,814 B1 | 8/2002 | Christensen et al. |
| 6,449,522 B1 | 9/2002 | Conboy et al. |
| 6,470,231 B1 | 10/2002 | Yang et al. |
| 6,482,269 B1 | 11/2002 | Shive et al. |
| 6,500,261 B1 | 12/2002 | Chen et al. |
| 6,504,123 B2 | 1/2003 | Beffa |
| 6,548,387 B2 * | 4/2003 | Hsu et al. .................... 438/585 |
| 6,551,409 B1 * | 4/2003 | DeGendt et al. ............... 134/2 |
| 6,787,480 B2 | 9/2004 | Aoki et al. |
| 2001/0014884 A1 | 8/2001 | Dillard et al. |
| 2002/0063085 A1 | 5/2002 | Capser |
| 2002/0071750 A1 | 6/2002 | Nering |
| 2002/0082740 A1 | 6/2002 | Akram et al. |
| 2003/0005377 A1 | 1/2003 | Debenham |
| 2004/0002784 A1 | 1/2004 | Yoshida et al. |
| 2004/0236533 A1 | 11/2004 | Beinglass et al. |
| 2006/0022321 A1 * | 2/2006 | Matsukawa et al. ......... 257/678 |
| 2007/0073501 A1 * | 3/2007 | Bieswanger et al. .......... 702/81 |

FOREIGN PATENT DOCUMENTS

| | | |
|---|---|---|
| EP | 0 690 482 A3 | 4/1996 |
| JP | 11121577 A | 4/1999 |
| JP | 2000206480 A | 7/2000 |

* cited by examiner

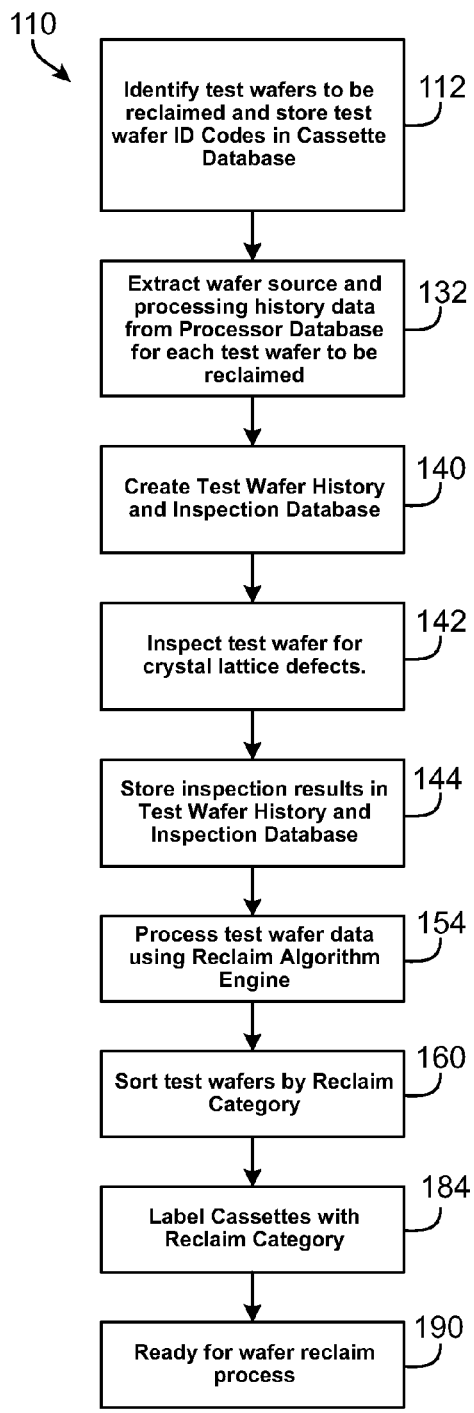
FIG. 2
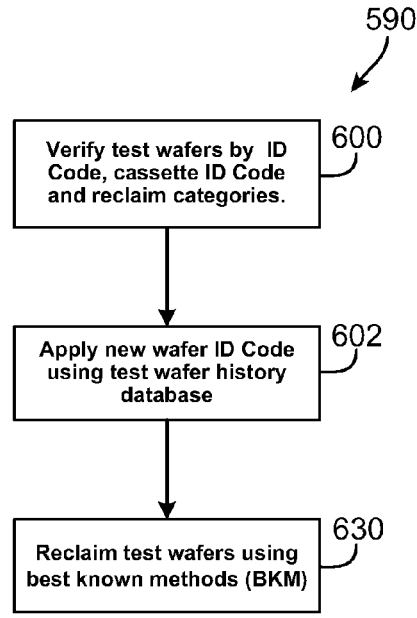
FIG. 13
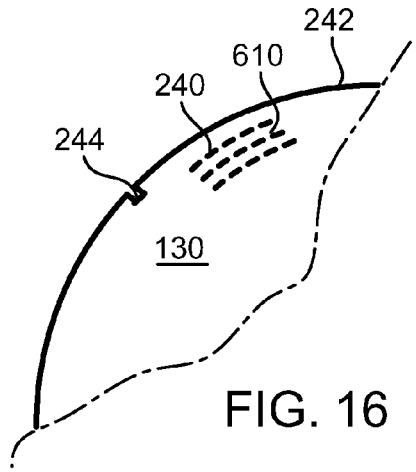
FIG. 16
612   614   616        618
 \     \     \          \
 Cu   XXYY  ZZ/ZZ/ZZ  1298723947
FIG. 17

Test Wafer History and Inspection Database

300a

| Test Wafer ID Code | | | | | Date Stamp | | |
|---|---|---|---|---|---|---|---|
| Step 1 | Process Type | Film Material | Film Thickness | Implant Depth | Diffusion Depth | ••• | |
| Step 2 | Process Type | Temp. ramp | Max Temp. | Cool rate | Total duration | ••• | |
| | 316 | 320 ⋮ | 322 | 324 | 326 | | 327 |
| Step n | Process Type | Film Material | Film Thickness | Implant Depth | Diffusion Depth | ••• | |
| Wafer source data | Inspection results | | Reclaim Category | Cassette IDCode | | | |
| 370 | 371 | | 392 | 472 | | | |

300b

| Test Wafer ID Code | | | | | Date Stamp | | |
|---|---|---|---|---|---|---|---|
| Step 1 | Process Type | Temp. ramp | Max Temp. | Cool rate | Total duration | ••• | |
| Step 2 | Process Type | Film Material | Film Thickness | Implant Depth | Diffusion Depth | ••• | |
| ⋮ | | | | | | | |
| Step n | Process Type | Film Material | Film Thickness | Implant Depth | Diffusion Depth | ••• | |
| Wafer source data | Inspection results | | Reclaim Category | Cassette IDCode | | | |

⋮

300n

| Test Wafer ID Code | | | | | Date Stamp | | |
|---|---|---|---|---|---|---|---|
| Step 1 | Process Type | Film Material | Film Thickness | Implant Depth | Diffusion Depth | ••• | |
| Step 2 | Process Type | Temp. ramp | Max Temp. | Cool rate | Total duration | ••• | |
| ⋮ | | | | | | | |
| Step n | Process Type | Film Material | Film Thickness | Implant Depth | Diffusion Depth | ••• | |
| Wafer source data | Inspection results | | Reclaim Category | Cassette IDCode | | | |

FIG. 4

Wafer ID Report

Cassette ID Code
Slot 1 ---- Wafer ID Code
Slot 2 ---- Wafer ID Code
Slot 3 ---- Wafer ID Code
Slot 4 ---- Wafer ID Code
.
.
.
Slot n ---- Wafer ID Code

Cassette ID Code
Slot 1 ---- Wafer ID Code
Slot 2 ---- Wafer ID Code
Slot 3 ---- Wafer ID Code
Slot 4 ---- Wafer ID Code
.
.
.
Slot n ---- Wafer ID Code

Cassette ID Code
Slot 1 ---- Wafer ID Code
Slot 2 ---- Wafer ID Code
Slot 3 ---- Wafer ID Code
Slot 4 ---- Wafer ID Code
.
.
.
Slot n ---- Wafer ID Code

Cassette ID Code
Slot 1 ---- Wafer ID Code
Slot 2 ---- Wafer ID Code
Slot 3 ---- Wafer ID Code
Slot 4 ---- Wafer ID Code
.
.
.
Slot n ---- Wafer ID Code

FIG. 8

Cassette No. 127563

Oxide Strip Process No. 5a

Date — Customer ID
Sorting Company — Reclaim Supplier

Test Wafer Manifest:
| 1. 34565 | 6. 34265 | 11. 44565 | 16. 347765 | 21. 94565 |
| 2. 937 | 7. 937 | 12. 385537 | 17. 75937 | 22. 7597 |
| 3. 86739 | 8. 7739 | 13. 48673 | 18. 416739 | 23. 48839 |
| 4. 385 | 9. 85325 | 14. 45385 | 19. 45385 | 24. 45585 |
| 5. 49305 | 10. 9325 | 15. 449305 | 20. 49301 | 25. 4905 |

FIG. 12

RECLAIMING SUBSTRATES HAVING DEFECTS AND CONTAMINANTS

BACKGROUND

Embodiments of the present invention relate to reclaiming substrates in semiconductor fabrication.

In fabricating electronic devices, various materials may be deposited onto a substrate, such as a semiconductor substrate or display, or subsequently etched from the substrate to form features such as interconnect lines. These materials may include metal-containing materials, such as for example, aluminum, copper, tantalum, tungsten, as well as their compounds. Other materials deposited onto substrates include silicon and various oxides and other nonmetallic materials. These materials may be deposited using a variety of techniques including sputtering (also referred to as physical vapor deposition or PVD), chemical vapor deposition (CVD) and thermal growth. In addition to depositing materials, other fabrication processes may be performed including doping semiconductor layers with impurities, diffusion, ion implantation, etching, chemical and mechanical polishing (CMP), cleaning and heat treatments.

In such fabrication processes, test substrates are often used to test whether a fabrication process is operating to specification. For example, to test a copper sputtering process, a test substrate may be placed into a copper sputtering tool and copper sputter deposited onto the test substrate. The test substrate may then be inspected to verify whether or not the resultant deposited copper layer is within specification. If not, the controls to the copper sputtering tool may be adjusted and the tool retested with the same or another test substrate until the desired copper deposition layer is reliably achieved.

With the constant pressure for driving costs down, reclaiming substrates which have been used for testing or monitoring processes, rejected for failing deposition or etch process criteria, or for other reasons, is a good alternative to buying new substrates. It is more cost effective to reclaim the used test substrates rather than simply discard the substrates. The reclamation process typically includes removing all the deposited layers and materials and removing some of the underlying silicon material so that the remaining silicon material of the test substrate is clean and substantially free of added materials or other contaminants. As a consequence, the reclamation process is intended to restore the test substrate to meet the same specifications as a new test substrate except for its thickness. For example, it is often desirable to reclaim test substrates that have contaminants. The reclamation process often has unique requirements when the contaminant comprises metallic species, such as elemental metal or metal compounds. To avoid contamination, it is often preferred that test substrates upon which metallic species have been deposited be reclaimed separately from other test substrates having no metallic deposits or only nonmetal depositions.

With the advancement in technology, more devices are manufactured using copper interconnects and lines, and substrates contaminated with copper-containing species, such as elemental copper or copper compounds, often need to be reclaimed separately from other substrates. The copper from copper-containing substrates can easily contaminate other substrates when they are reclaimed in the same bath used for reclaiming other substrates or even through use of re-circulated polishing slurry. Furthermore, tests for contamination of the substrate surface using ICP-MS (inductively coupled plasma mass spectroscopy) methods do not detect copper which has diffused from the surface into the bulk of the silicon substrate. This can result in shipping to customers, substrates with high levels of copper contamination in the bulk of the substrate. Subsequently, long storage periods or elevated temperatures during transport and warehouse conditions can cause the copper to diffuse from the bulk to the surface where it negatively affects the devices formed on the substrate.

One process of removing metallic contaminants, such as copper, is described in U.S. Pat. No. 6,054,373, Entitled "Methods of and Apparatus for Removing Metallic Impurities Defused in a Semiconductor Substrate", issued on Apr. 25, 2005, which is incorporated herein by reference in its entirety. This patent describes a process in which a substrate is heated in-situ in an acidic bath of sulfuric acid. However, after removing copper contaminants from a batch of substrates, the resultant chemical bath contains high levels of copper contaminants, which may diffuse into substrates subsequently dipped into the bath. Cross-contamination is a particular problem when a second substrate comprising a low level of surface contamination is treated after a first substrate having a high level of surface contamination, in which case, copper from the first substrate often further contaminates the second substrate.

To segregate the substrates prior to reclamation, used test substrates destined for reclamation are often sorted into one of a few reclamation categories and then stored in cassettes. Notes may be jotted onto each cassette label indicating the particular category (such as "lattice defect type", "copper", "metal" or "nonmetal") to which the test substrates in the cassette is believed to belong. The test substrates may then be transferred to an in-house reclamation service operator or shipped to an outside service provider. The test substrates are often shipped or transferred in bulk, that is, hundreds or thousands at a time. The reclamation service operator, upon receipt of the test substrates, takes note of any notices written on the cassette labels, removes the test substrates from the cassettes, visually inspects the test substrates and sorts them by reclamation category, again, typically the "copper", "metal" or "nonmetal" categories. The test substrates of each category are then processed using a reclamation process appropriate for that particular category.

One system in which test substrates are reclaimed by reading from a database the process steps performed on each of a plurality of test substrates and selecting a particular reclamation process for each test substrate, is described in U.S. Pat. No. 6,954,722, entitled "TEST SUBSTRATE RECLAMATION METHOD AND APPARATUS", issued on Oct. 11, 2005, assigned to the assignee of the present application and incorporated by reference in its entirety. For example, where the process steps performed on the test substrates include material deposition; the data read from the database can include data representing the type of material deposited and the thickness of the deposited material in a process step. A reclamation process may then be selected for each test substrate, which is appropriate for that test substrate depending upon the types of materials deposited on the test substrate and the thickness of each deposition. Reclamation processes may be selected based upon other processes performed on the test substrates including ion implantation, CMP, cleaning, thermal treatments and etching and the details concerning those processes. The information identifier for each test substrate, the processes performed on that test substrate and the reclamation process selected for that test substrate, may be stored in a test substrate history database.

In addition, each test substrate for which a reclamation process has been selected may be sorted and placed into a group of test substrates having a common reclamation process assigned to the test substrates of the group. For example, the test substrates may be sorted in an automated system in which an identification code is read from each test substrate by a scanner or other suitable reader, the reclamation process assigned to that test substrate is read from a database and the test substrate is placed by a robot or other automated substrate handlers in a cassette or other bin containing additional test substrates assigned with the same or similar reclamation process.

Also, the bins in which the sorted test substrates are stored may each be labeled with identifying information including basic or detailed information on the reclamation process selected for the test substrates stored in the bin. The information may also include a list of the test substrates stored in each bin. The information identifier for each bin, the test substrates stored in the bin and the reclamation process selected for those test substrates may also be stored in a database for those bins.

The sorted test substrates may be removed from the bins by a reclamation operator in an automated system in which an identification code is read from each test substrate by a suitable reader. The reclamation process assigned to that test substrate can be read from a database supplied to the operator to verify which reclamation process was assigned to each test substrate prior to reclaiming the test substrate.

SUMMARY

Test substrates used to test semiconductor fabrication tools are sorted for reclaiming the substrates. In one method. a plurality of test substrate identification data is read from a plurality of test substrates. For each read test substrate, stored test substrate data describing the read test substrate is obtained from a database. Each read test substrate is assigned a crystal lattice defect reduction treatment associated with the stored test substrate data for the read test substrate.

A system to reclaim test substrates each bearing an identification code. The system comprises a reader to read an identification code from a test substrate and a controller. The controller has a memory to store a database comprising data representative of the identification code for each test substrate and associated data representative of a crystal lattice defect reduction treatment. The controller also has program code to obtain from the database, for each read test substrate, stored test substrate data describing each read test substrate and to assign to each read test substrate, a crystal lattice defect reduction treatment associated with the stored test substrate data for the read test substrate.

An article of manufacture for reclaiming test substrates used to test semiconductor fabrication tools. The article of manufacture comprises program code implemented in a computer readable medium capable of causing a controller to (a) store in a database, a plurality of test substrate identification data, each test substrate identification data identifying a particular test substrate of a plurality of test substrates; (b) select a crystal lattice defect reduction treatment from a plurality of crystal lattice defect reduction treatments, for reclaiming each of said plurality of test substrates identified by said plurality of test substrate identification data; and (c) store into the database, a plurality of test substrate crystal lattice defect reduction treatment identification data associated with a stored test substrate identification data to identify the reclamation process selected to reclaim the test substrate.

A computer readable medium including a computer database of data, for reclaiming test substrates used to test semiconductor fabrication tool. The computer readable medium comprises a plurality of test substrate identification data, each test substrate identification data identifying a particular test substrate of a plurality of test substrates. A plurality of crystal lattice defect reduction treatment data, each crystal lattice defect reduction treatment data being associated with a test substrate identification data.

A method of reclaiming test substrates used to test semiconductor fabrication tools comprises reading a plurality of test substrate identification data from a plurality of test substrates; obtaining from a database, for each read test substrate, stored test substrate data describing each read test substrate; and assigning each read test substrate a metallic contaminant reduction treatment associated with the stored test substrate data for each read test substrate.

A method of reclaiming test substrates used to test semiconductor fabrication tools, comprising:

(a) reading a plurality of test substrate identification data from a plurality of test substrates;

(b) obtaining from a database, for each read test substrate, stored test substrate data describing each read test substrate; and (c) assigning each read test substrate a copper contaminant reduction treatment as a function of the stored test substrate data for each read test substrate.

A method of reclaiming substrates comprises providing a substrate comprising a metallic contaminant at a first surface concentration level. The substrate is heated to cause metallic contaminant in the bulk of the substrate to diffuse to the surface of the substrate. Thereafter, the substrate is quenched at a quench rate that is sufficiently high to obtain a second surface concentration level of the metallic contaminant, after quenching, that is at least about 20% higher than the first surface concentration level. The substrate can be heated, for example, in a electrical resistance heated furnace or by applying microwave radiation to the substrate. The method can also be used to inspect and detect increased surface concentration levels of the metallic contaminant in the substrate.

DRAWINGS

These features, aspects, and advantages of the present invention will become better understood with regard to the following description, appended claims, and accompanying drawings, which illustrate examples of the invention. However, it is to be understood that each of the features can be used in the invention in general, not merely in the context of particular drawings, and the invention includes any combination of these features, where:

FIG. 2 is a flow chart representing an example of a reclaiming preparation process;

FIG. 4 is a schematic diagram of an example of a test substrate history and inspection database;

FIG. 8 is an example of a report for test substrates and cassettes;

FIG. 12 is an example of a recycle cassette label;

FIG. 13 is a flow chart representing an example of a reclaim process;

FIG. 16 depicts an example of identification codes placed on a test substrate;

FIG. 17 illustrates an example of an identification code for a test substrate which reflects the processing history of the test substrate.

DESCRIPTION

Figure 1:
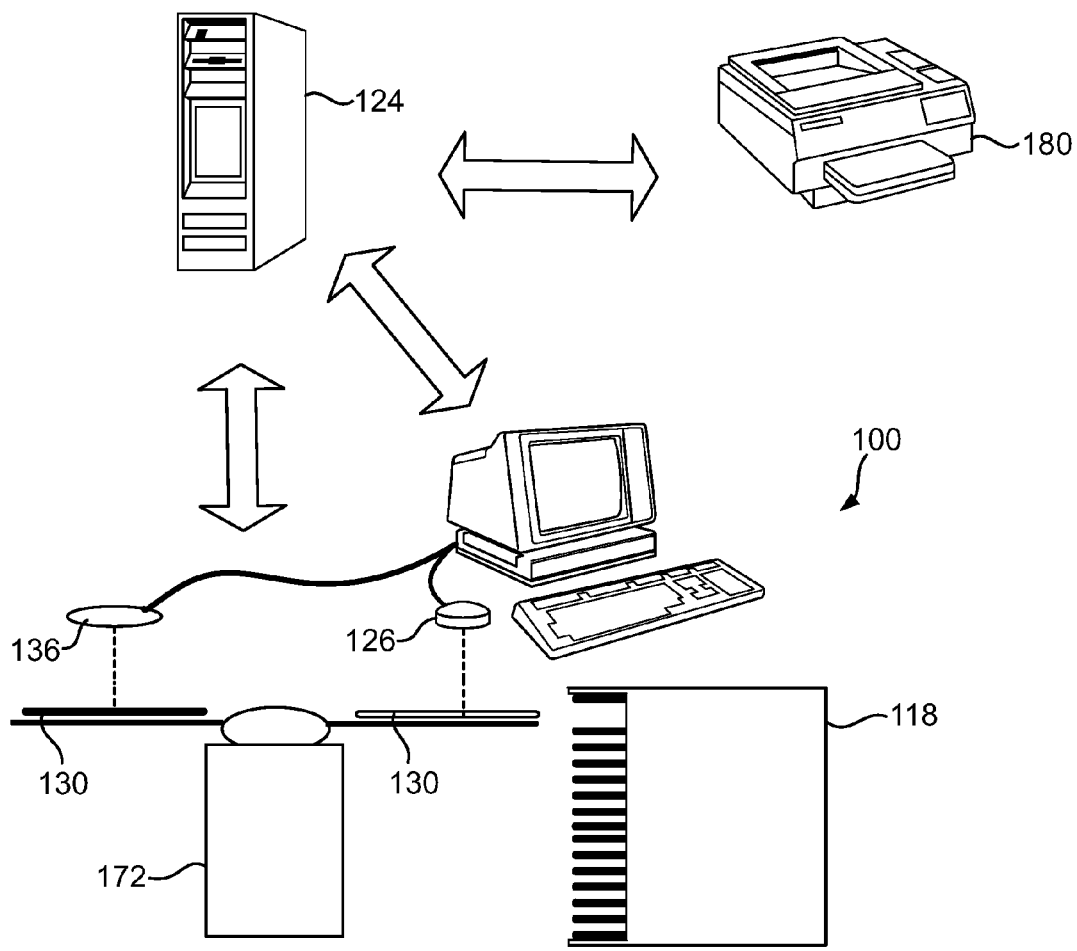
FIG. 1 is a schematic diagram of an exemplary example of a reclaiming and sorting system.

FIG. 1 illustrates one example of a computerized system 100 which is believed capable of significantly enhancing reclamation of substrates, such as used test substrates and other substrates used in the fabrication of semiconductor devices and displays. The system 100 is used in a reclamation preparation process, an example of which is summarized in FIG. 2. For example, the system 100 can be used to facilitate reclamation of test substrates having crystal lattice defects or metallic contaminants; particularly those defects and contaminants occurring near the substrate surface. In one aspect, test substrates may be identified and sorted into groups deemed likely to have one or more types of defects or contaminants, or minimum levels of defects or contaminants. For example, test substrates which are identified as coming from the same ingot section may be considered likely to have crystal lattice defects where other test substrates fabricated from the same ingot section have been determined to have crystal lattice defects. Also, test substrates may be sorted in groups considered likely to have crystal lattice defects as a result of having undergone a common processing step, such as a high temperature anneal treatment, which has been determined likely to induce or exacerbate crystal lattice defects. Similarly, substrates subjected to metal deposition processes can be subject to higher levels of metal contaminants.

In another aspect, incoming test substrates may be inspected by an in-line sensor comprising automated or semi-automated inspection equipment which can detect the likely presence of crystal lattice defects, metal contaminants, or their levels. Those test substrates determined likely to have crystal lattice defects may be sorted into groups where each group is assigned a common crystal lattice defect reduction treatment suitable for the identified crystal lattice defects of the group, and the same for metal contaminants.

In the example of the reclamation preparation process 110, the test substrates to be reclaimed are identified (block 112) by the system 100 and stored into cassettes 118, each of which is preferably assigned a unique identification code which may include alphanumeric or other symbols. Although the illustrated system is described in connection with silicon test substrates and cassettes, it is appreciated that certain embodiments may be directed to other types of test semiconductor and non-semiconductor substrates including silicon on insulator (SOI), gallium arsenide, germanium, silicon germanium, glass and other test substrates. Also, it is appreciated that storage containers or bins other than cassettes may be used. One example is a FOUP used to transport 300 mm substrates.

Figures 3, 14:
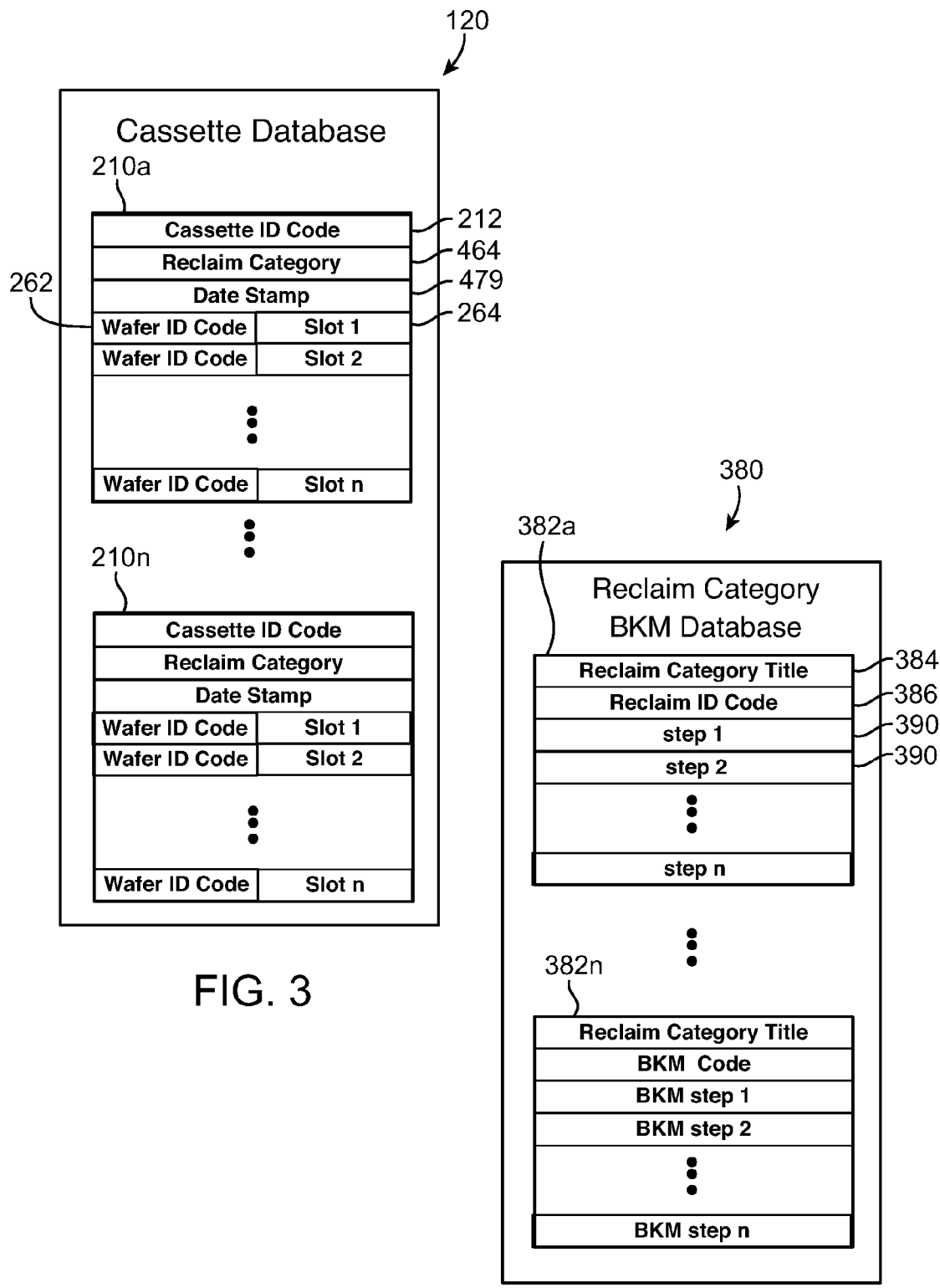
FIG. 3 is a schematic diagram of an example of a recycle cassette database.
FIG. 14 is a schematic diagram of an example of a database.

FIG. 3 is a schematic representation of one example of a computer database 120 in which the system 100 stores the identification code of each test substrate to be reclaimed and the identification code of the particular cassette 118 in which each such test substrate is stored. The system 100 includes a controller 300 comprising a suitable computer or computer network 124 (FIG. 1), which maintains the cassette database 120. A reader 126 reads the identification code from each test substrate 130 to be reclaimed, for storage in the database 120.

In accordance with another aspect of the illustrated reclamation process 110, the system 100 may also extract (block 132, FIG. 2) substrate source history data, including the ingot and the section of the ingot from which the test substrate was fabricated. The extracted substrate data may also include the processing history of each test substrate to be reclaimed. This processing history may include data describing the various layers, if any, deposited onto the test substrate and other processes performed on the test substrates including, anneals, etching, cleaning, polishing etc. Silicon ingot fabricators frequently maintain databases, which track each substrate from the source ingot and the section of the ingot producing the substrate.

Also tracked are processes performed on each substrate passing through a fabrication system such as an integrated circuit fabrication plant. Accordingly, this source and processing history data may be extracted from preexisting databases by the system 100 and stored (block 132) in a test substrate history and inspection database created (block 140, FIG. 2) by the system 100 for each test substrate identified as being prepared for reclamation. FIG. 4 shows an example of such a test history and inspection database 150 in which the source of each test substrate and each of the processing steps performed on a test substrate is stored in association with the identification code of the particular test substrate.

In another aspect, each test substrate to be reclaimed may also be inspected (block 142) for crystal lattice defects. Such an inspection may be performed manually or may be performed by suitable automated inspection equipment such as an in-line optical or X-ray sensor 136 (FIG. 1) of the system 100. The inspection results may be stored (block 144) in the test substrate history and inspection database created (block 140, FIG. 2) by the system 100 for each test substrate identified as being prepared for reclamation.

Using the test substrate history database 150, the system 100 can examine (block 154, FIG. 2) the source data of each test substrate, the processing steps performed on a particular test substrate, and the inspection results for each test substrate, and determine which of a plurality of methods for reclaiming that particular test substrate would be suitable including a suitable crystal lattice defect or metallic contaminant reduction treatment. For example, if a test substrate was obtained from a particular section of a particular ingot which has produced substrates having crystal lattice defects, it may be determined that the test substrate has a high likelihood of also having similar crystal lattice defects. Accordingly, a suitable crystal lattice defect reduction treatment may be assigned that test substrate.

As another example, the test substrate processing history may indicate that the test substrate has undergone a high temperature anneal in the fabrication facility. Moreover, the anneal process may be of a type which induces or exacerbates crystal lattice defects. Again, a suitable crystal lattice defect reduction treatment may be assigned that test substrate.

As yet another example, the inspection results may indicate a high likelihood of crystal lattice defects in that particular test substrate. It is appreciated that some inspection machines may not readily distinguish between surface particles and crystal lattice defects. Also, some prior processing operations such as film depositions may obscure the defects, particularly for optical sensors. Accordingly, in some applications, the inspection may be performed after deposition removal, cleaning, or polishing has already occurred in the overall reclamation process to facilitate the inspection process. Other inspection sensors such as X-ray devices may be appropriate to detect crystal lattice defects before substantial reclamation processing has begun such as prior to removal of deposition films, cleaning, polishing, etc. However, in some applications it may be appropriate to remove metal depositions prior to x-raying the test substrate.

As yet another example, the inspection results may indicate a high likelihood of metallic contaminants in a particular test substrate. For example, if the test substrate processing history may indicate that the test substrate has undergone a metallic material deposition process, and/or a high temperature anneal after deposition. A suitable metal contaminant defect reduction treatment may be assigned that test substrate, for example, a copper defect reduction treatment for a copper contaminated substrate.

It is appreciated that the test substrates may be more efficiently reclaimed by utilizing a database such as the test substrate history and inspection database 150 to select a reclamation method particularly suited for that particular test substrate. In the illustrated embodiment, the system 100 includes a reclaim algorithm engine which identifies a method for reclaiming each test substrate based upon the detailed source and processing history and inspection results of that test substrate, and stores data identifying that selected method in one or more of the databases 120 and 150 of the system 100.

Figure 5:
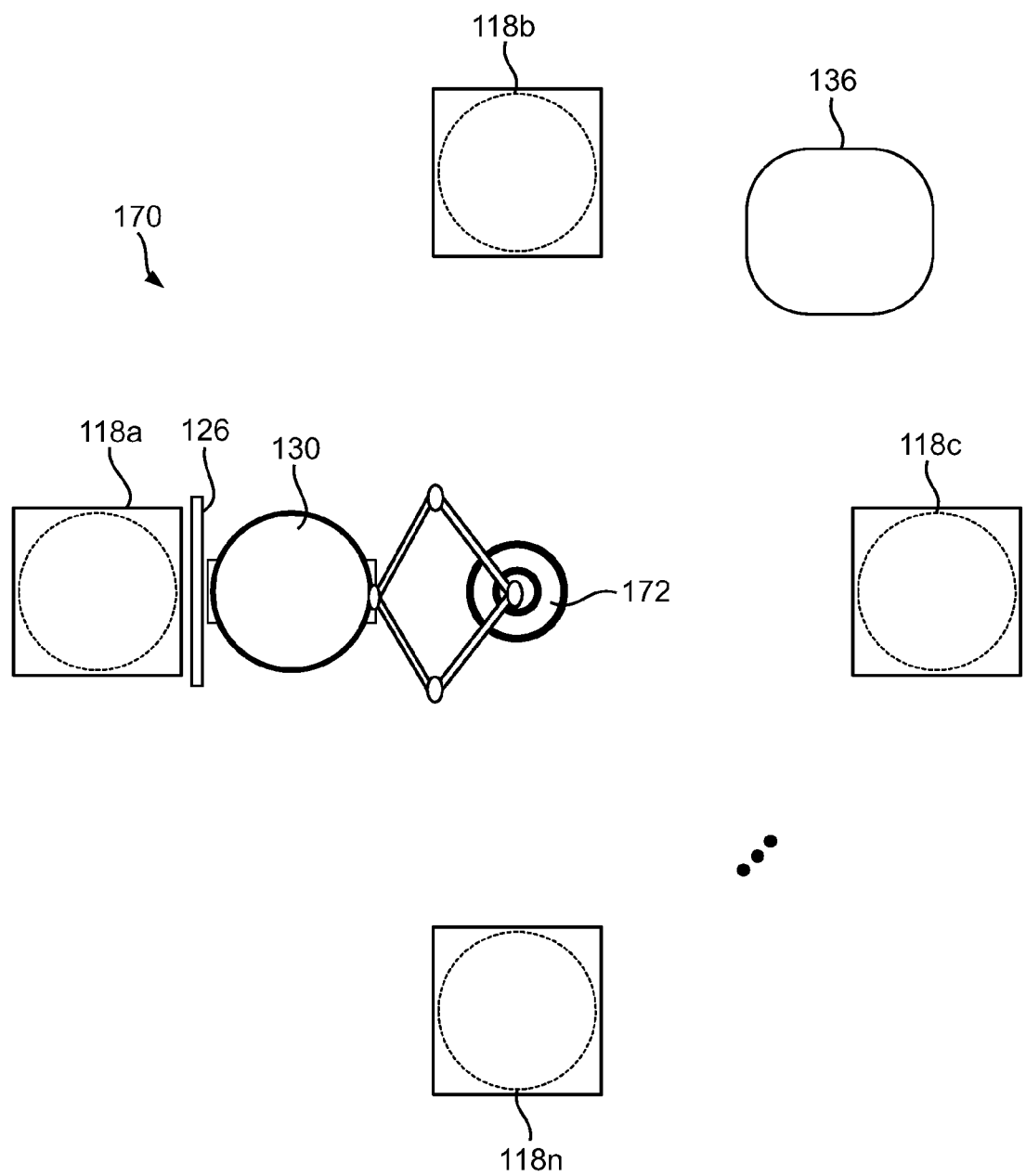
FIG. 5 is a schematic diagram of an example of a test substrate sorting apparatus.

Once the appropriate reclaiming methods have been identified for one or more test substrates, that information may be used by the system 100 to sort (block 160, FIG. 2) test substrates into various categories, on the basis of the method selected for each test substrate. FIG. 5 shows an example of a robotic system 170 of the system 100, which includes a robot 172 capable of removing a test substrate 130 from any of a plurality of storage cassettes or other storage bins 118a, 118b, 118c . . . 118n and storing the test substrate into any of the other storage cassettes 118a, 118b, 118c . . . 118n. In the illustrated embodiment, positioned adjacent one or more bins is a reader 126a, 126b . . . 126n, such as an optical scanner or other type, which permits the test substrate to be scanned as it is withdrawn from or inserted into the associated cassette to verify the test substrate identification code of the test substrate being handled by the robot 172.

In addition, the system 170 may include an in-line sensor 136 to perform inspections of the substrates 130 for crystal lattice defects or metal contaminants as the test substrate is handled by the robot 172. These inspections may be performed as test substrates are being identified for reclamation, during the reclamation process or after all reclamation steps have been performed except any defect or contaminant reduction treatment, which may subsequently be assigned.

Figure 6:
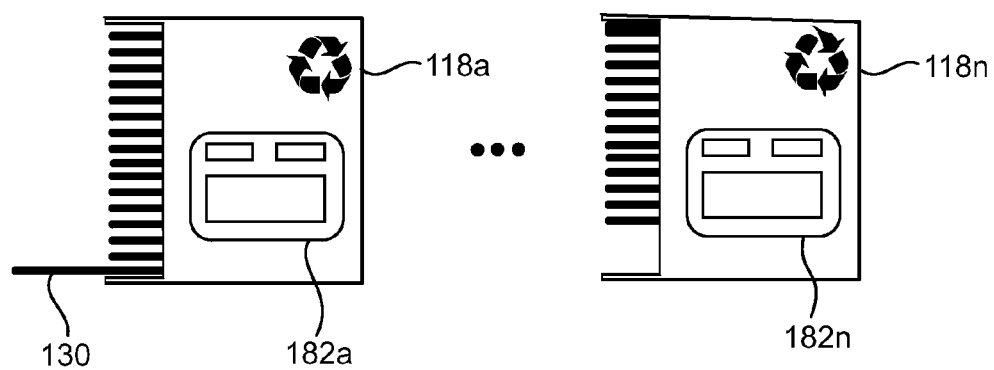
FIG. 6 illustrates examples of recycle cassettes with a printed label attached.

In one example, all the test substrates, which have been assigned one particular reclamation method or category may be stored in one cassette up to the capacity of that cassette. The system 100 includes a printer 180 (FIG. 1) to print a label 182a . . . 182n (FIG. 6) for each cassette 118a, 118n, respectively. Each label may be attached (block 184, FIG. 2) to the associated cassette and may identify by identification codes, each test substrate stored in the cassette by the robotic sorting system 170 and the particular reclamation method selected by the reclamation algorithm engine for each of the test substrates in the cassette, as well as other information as described below. The test substrates of each cassette are then ready (block 190, FIG. 2) to proceed to be reclaimed using the reclamation process identified by the label attached to the cassette storing the test substrates. The reclamation process may include or constitute one or more suitable crystal lattice defect or metallic contaminant reduction treatments.

Figure 7:
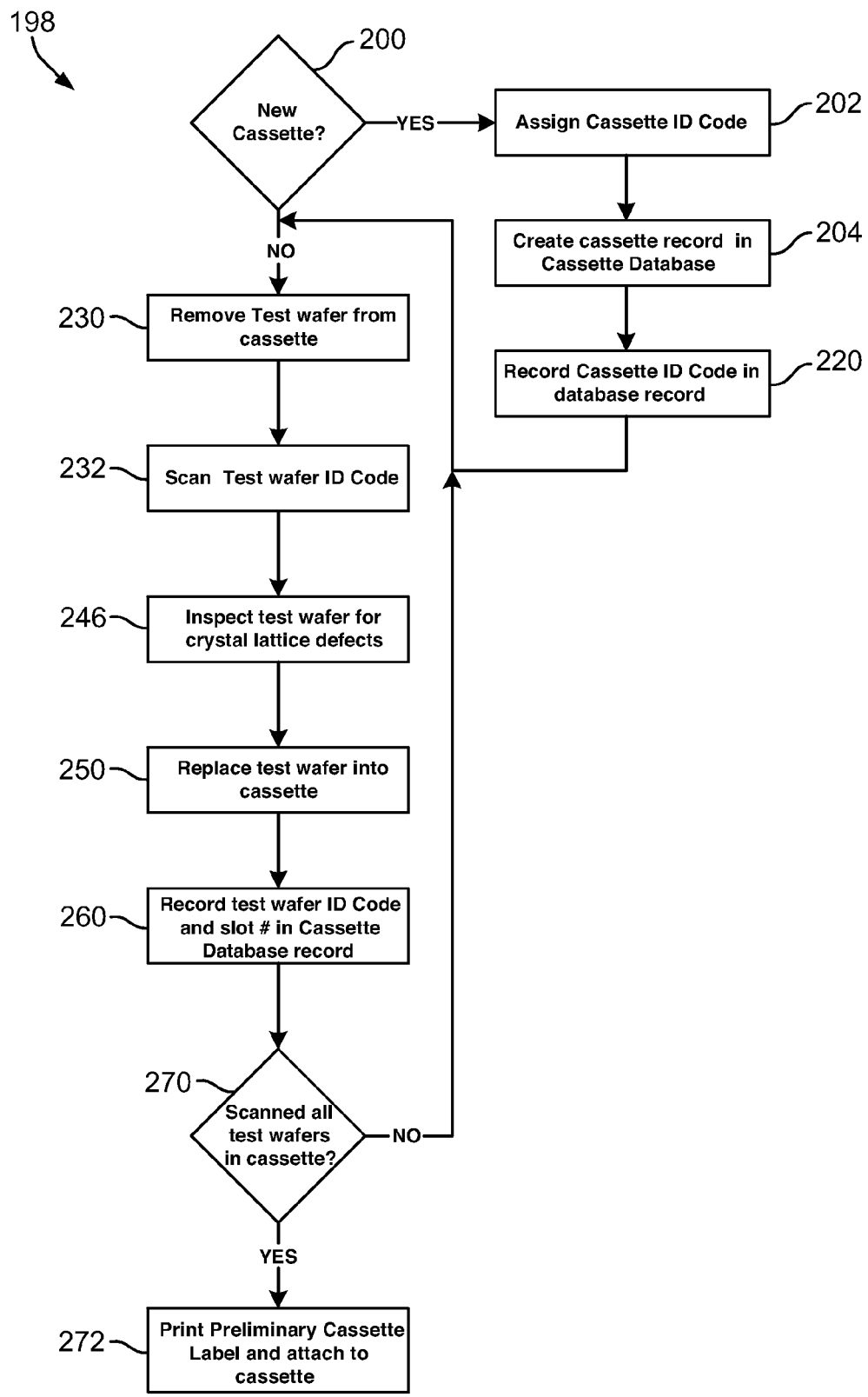
FIG. 7 is a flow chart representing an example of operations used to map test substrates and cassettes and inspect test substrates.

FIG. 7 shows in greater detail an example of operations 19, which may be performed to identify (block 112, FIG. 2) and inspect (block 142) the test substrates to be reclaimed and the cassettes in which the test substrates are stored. If (block 200) a new cassette of test substrates is to be identified, the cassette is assigned (block 202) a unique cassette identification code and a new record is created (block 204) in the cassette database 120. As shown in FIG. 3, the cassette database 120 has a record 210a . . . 210n for each cassette 118a . . . 118n, respectively. Each record has a field 212 in which the cassette identification code is stored (block 220, FIG. 7). In the illustrated embodiment, the cassette identification code may be a series of symbols including alphanumeric characters and other arbitrary symbols, which uniquely identify a particular cassette.

Once a record has been created in the cassette database 120 for the cassette being processed and the identification code of the cassette has been stored in the appropriate field 212, or if (block 200) the cassette already has an associated record in the cassette database 120, the robot 172 removes (block 230) a test substrate from the cassette, a scanner 126 scans (block 232) the test substrate to read the test substrate identification code. Like the cassette identification code, the substrate identification code may be a series of symbols including alphanumeric characters and other symbols, which uniquely identify a particular test substrate. These test substrate identification codes are often inscribed directly onto the front or back surfaces of the test substrate, often using lasers.

FIG. 16 shows an example of a test substrate identification code 240 laser scribed near the edge 126 of a test substrate 130. Test substrates often have a notch 244, or flattened edge (not shown) or other orientation features which facilitate robotic handling. The test substrate identification code 240 is preferably of a type readily discernible by readers 126 such as optical scanners or other reading devices to facilitate automated handling of the substrates.

In addition, the test substrate may be inspected (block 246) for crystal lattice defects, metallic contaminants, or their levels. Once the identification code of the substrate has been read, (and the substrate inspected, if appropriate) the test substrate may be replaced (block 250, FIG. 7) into the same or a different cassette. In addition, the test substrate identification code read from the test substrate is stored (block 260) into the cassette database 120 in a field 262 (FIG. 3) of the record associated with the particular cassette into which the test substrate is placed. Many cassettes or other storage bins often have slots, which support each individual substrate. These slots are often uniquely identified by individual slot numbers. In this example, each cassette has a plurality of slots, numbered slot 1, slot 2 . . . slot n. Accordingly, the slot number slot 1, slot 2 . . . slot n of the slot in which the test substrate is stored may be recorded (block 260) into a field 264 associated with the identification code of the test substrate stored in that slot.

Once all (block 270) of the test substrates of the cassette being processed have been scanned and inspected, a preliminary cassette label may be printed (block 272) by the printer 180 of the system 100 and attached to the cassette. This preliminary label may include information such as the cassette identification code and may also include a list by substrate identification codes, of the test substrates stored in the cassette for reclamation. The cassette and test substrate identification process of FIG. 7 may be repeated for all the cassettes of test substrates destined to be reclaimed or in the process of being reclaimed.

The identification information for all these cassettes and test substrates may also be printed in a report an example of which is shown in FIG. 8. This report 280 could include a list of the cassettes containing test substrates to be reclaimed in which each cassette is identified by its unique cassette identification code and a list of the test substrates stored in each cassette. The information for each test substrate may include the test substrate's identification code and the cassette slot number in which the test substrate is stored.

Figure 9:
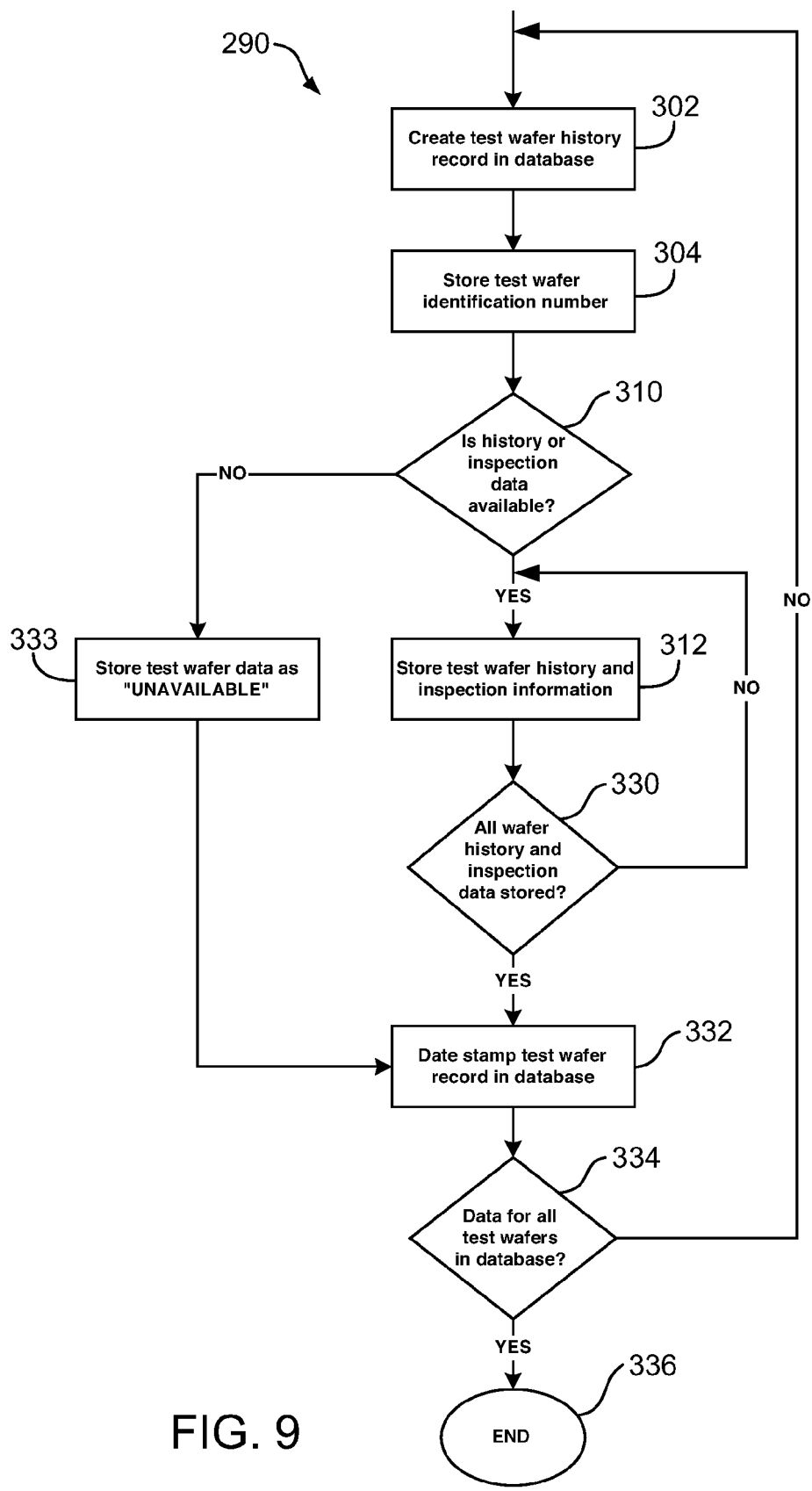
FIG. 9 is a flowchart representing an example of operations to create a test substrate history and inspection database.

FIG. 9 shows in greater detail an example of operations 290 which may be performed to create (block 140, FIG. 2) a test substrate history and inspection database such as the database 150 illustrated in FIG. 4. The operations of FIG. 9 are preferably performed after one or more test substrates have been identified and inspected in a manner similar to that described above in connection with FIG. 7. Thus, test substrate history data may be stored in the test substrate history and inspection database 150 after each test substrate is identified by a reader and inspected by an inspection device or alternatively, data may be stored in the test substrate history data base for a batch of test substrates after that batch of test substrates has been identified by the operations of FIG. 7 for example.

To add test substrate history data to the test substrate database 150, a record such as record 300a (FIG. 4) is created (block 302, FIG. 9) for an individual test substrate and the identification code for that particular test substrate is stored (block 304) in a field 306. If history data and/or inspection result data is available (block 310) for that test substrate, substrate data is stored (block 312) in the record 300 describing the source of the substrate and/or one or more processes performed on the test substrate. In the example of FIGS. 4 and 9, data is preferably stored for each fabrication-processing step performed on the test substrate. This data may include a step number for each processing step, which is stored in a field 314 to indicate the chronological order in which the various processing steps were performed on the test substrate. In addition, data identifying the type of process performed in each step may be stored in a field 316, for example. The various processes identified for a particular processing step may include, for example, anneal, CVD, PVD, thermal growth, doping, diffusion, ion implantation, etching, CMP, cleaning, defect inspections, etc. In addition, for each processing type, additional data may be stored in various fields. For example, for an anneal step, the temperature ramp rate may be stored in a field 320, the maximum temperature may be stored in a field 322, the cool rate may be stored in a field 324, the total duration of anneal may be stored in a field 326 etc. For film deposition, the type of material (such as copper, aluminum, nitride, oxide, etc.) being deposited may be stored in a field and the thickness of the film (such as 0 (if none), or 500 Angstroms, 1000 Angstroms etc.) may be stored in another field. For ion implantation, the ion type could be stored in a field, and the implantation depth (such as 0 (if none), or 250 Angstroms, 1500 Angstroms etc.) could be stored in a field. For diffusion processes, the diffusion depth could be stored in a field.

The source data for the test substrate, including the ingot identification and the ingot section identification data may be stored in a field 370. The results of the crystal lattice defect or metallic contaminant inspection may be stored in a field 371.

It is believed these types of information for the test substrates can be used by the system 100 to facilitate selection of an appropriate reclamation method such as a crystal lattice defect reduction treatment for each test substrate in the database 150 as a function of the substrate source, the substrate inspection results, and/or the details of the processes performed on the particular test substrate, including high temperature anneal processes. There is of course additional information, which may be stored in additional fields such as field 327 for these and other types of processes, inspections and substrate history for use in selecting the appropriate reclamation process including a crystal lattice defect or metallic contaminant reduction treatment.

As previously mentioned, in the example of FIGS. 4 and 9), data is preferably stored for each fabrication-processing step performed on the test substrate. Hence, the history and inspection data storage (block 312) is continued until all history and inspection steps (block 330) have been stored in the database 150. The substrate data may be "date stamped" by storing (block 332) the date the substrate processing history and inspection data was stored into the database 150 in a field 334. It is appreciated that processing history or inspection data may not be available for every test substrate to be reclaimed. If the substrate data is unavailable (block 310), the system 100 can proceed to store (block 333) a suitable indication such as "UNAVAILABLE" into an appropriate field of the record for that test substrate and proceed to the date stamp operation (block 332).

If the source and processing history and inspection data have been stored into the database 150 for the test substrates (block 334) identified as being destined for reclamation, the system 100 can end (block 336) the test substrate history and inspection database storage operations and begin to determine the appropriate reclamation method for each test substrate of the database 150 as described below. If not, the operations of FIG. 9 may be repeated, creating (block 302) a record for each remaining test substrate and storing the test substrate processing history data for each remaining test substrate as described above.

Figure 10:
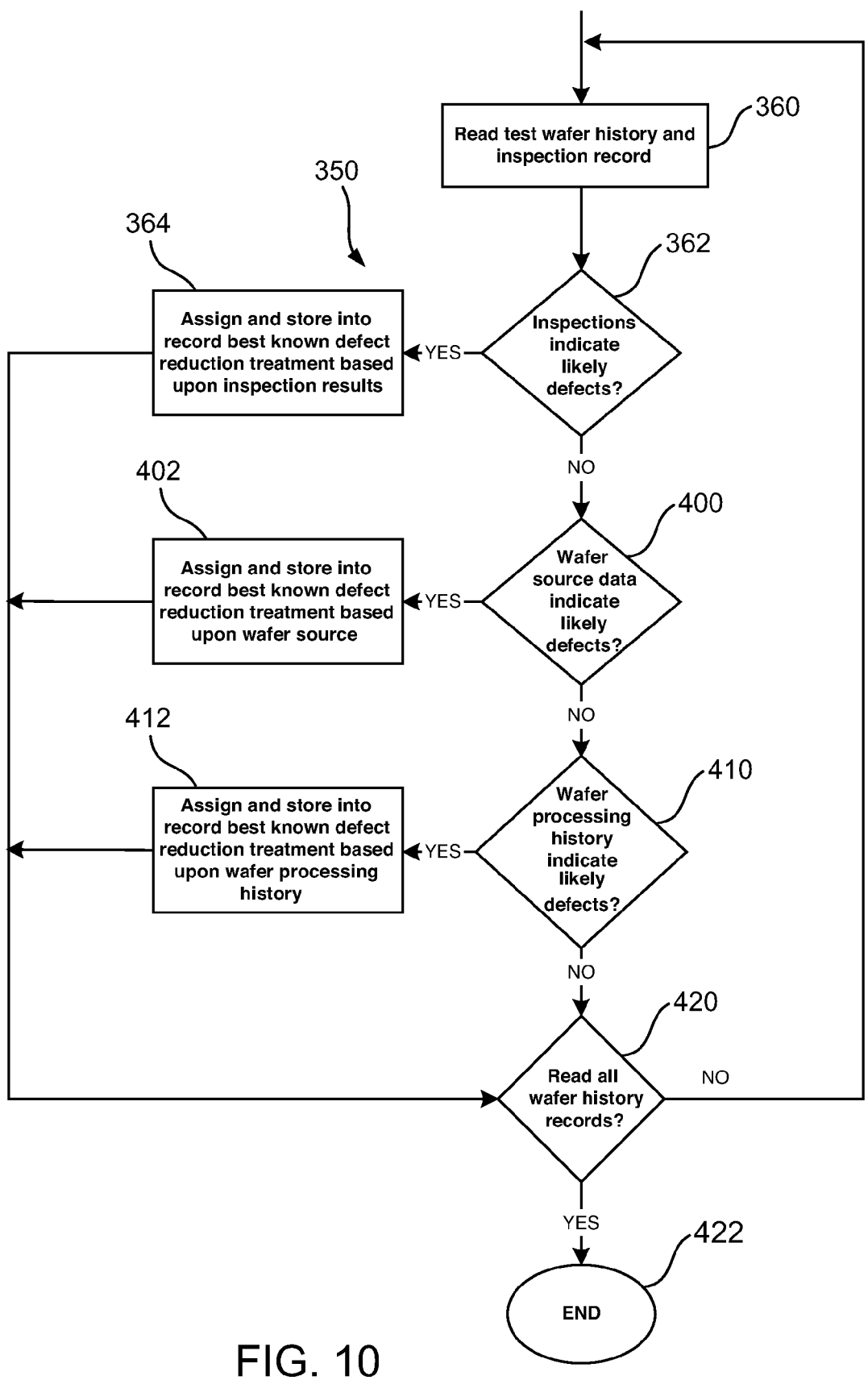
FIG. 10 is a flowchart representing an example of operations of a reclaim algorithm engine.

FIG. 10 shows in greater detail an example of operations 350 which may be performed to process (block 154, FIG. 2) a test substrate history and inspection database such as the database 150 illustrated in FIG. 4, using a reclaim algorithm engine to identify the appropriate reclamation method, in this example, a crystal lattice defect or metallic contaminant reduction treatment, for each test substrate of the database 150, as appropriate. The operations of FIG. 10 are preferably performed after one or more test substrates have been identified in a manner similar to that described above in connection with FIG. 7 and the processing history, source history and inspection data has been stored in the database 150 for those test substrates. Thus, a reclamation method may be selected and stored in the test substrate history database 150 after an individual test substrate is identified by a reader or alternatively, reclamation methods may be selected and stored in the test substrate history data base for a batch of test substrates on an individual basis after the test substrates of the batch have been identified by the operations of FIG. 7 for example and the substrate data has been stored for each of the test substrates of the batch of test substrates by the operations of FIG. 9, for example.

To determine whether a crystal lattice defect reduction treatment is appropriate and if so, to select the appropriate crystal lattice defect or metallic contaminant reduction treatment for a test substrate, a record 300a, 300b . . . 300n in the test substrate history and inspection database 150 is read (block 360) for a particular test substrate. The records 300a, 300*b* . . . 300*n* may be processed in order or a particular record 300*a*, 300*b* . . . 300*n* selected for a particular test substrate. The record 300*a*, 300*b* . . . 300*n* which is read is examined (block 362) to determine whether the inspection results for the test substrate associated with that database record indicate a likelihood of crystal lattice defect or metallic contamination. If so, a crystal lattice defect or metallic contaminant reduction treatment is assigned (block 364) based upon the inspection results, and if appropriate, the substrate processing history, and is stored in a field 392 of the record for that test substrate.

The system 100 preferably includes a database such as the database 380 of FIG. 14 in which detailed instructions may be stored for a large number of different reclamation processes including crystal lattice defect or metallic contaminant reduction treatments. Thus, the database 380 may include for example, a record 382*a* . . . 382*n* for each reclamation process in which each record includes a title or other brief description of the reclamation process in a field 384, an identification code in a field 386, and a plurality of fields 390 which detail the various steps of the reclamation process. In this example, the reclamation processes could include a collection of the methods for reclaiming a particular type of test substrate having particular types of crystal lattice defects. It is further appreciated that the detailed processing history stored for each test substrate to be reclaimed readily permits the reclamation methods to be modified to increase the efficiency of the reclamation processes.

Once a preferred defect or contaminant reduction reclamation process has been selected from the reclamation process database 380 for a particular test substrate, based upon the inspection history and if appropriate, the processing history stored in the database 150 for that test substrate, the identification code for the selected reclamation process is stored (block 364) in a field 392 of the record 300*a* . . . 300*n* of the database 150 associated with that particular test substrate.

If the inspection results do not indicate likely crystal lattice defects or metallic contaminants, the record 300*a*, 300*b* . . . 300*n*, which is read, may also be examined (block 400) to determine whether the source data including the source ingot section from which the substrate was fabricated, indicate a likelihood of lattice defects or contaminants. If so, a lattice defect or metallic contaminant reduction treatment is assigned (block 402) based upon the substrate source data, and the substrate processing history if appropriate, and is stored in a field 392 of the record for that test substrate.

If the substrate source data does not indicate likely lattice defects or metallic contaminants, the record 300*a*, 300*b* . . . 300*n*, which is read may also be examined (block 410) to determine whether the substrate processing history indicates a likelihood of lattice defects or metallic contaminants. If so, a crystal lattice defect or metallic contaminant reduction treatment is assigned (block 412) based upon the substrate processing history, and is stored in a field 392 of the record for that test substrate.

The reclaim algorithm engine of FIG. 10 continues examining each record of the test substrates identified for reclamation and selecting an appropriate reclamation process for each such test substrate and storing the reclamation process identification code into the associated record for that test substrate until all (blocks 420, 422) the test substrate history records have been processed.

Figure 11:
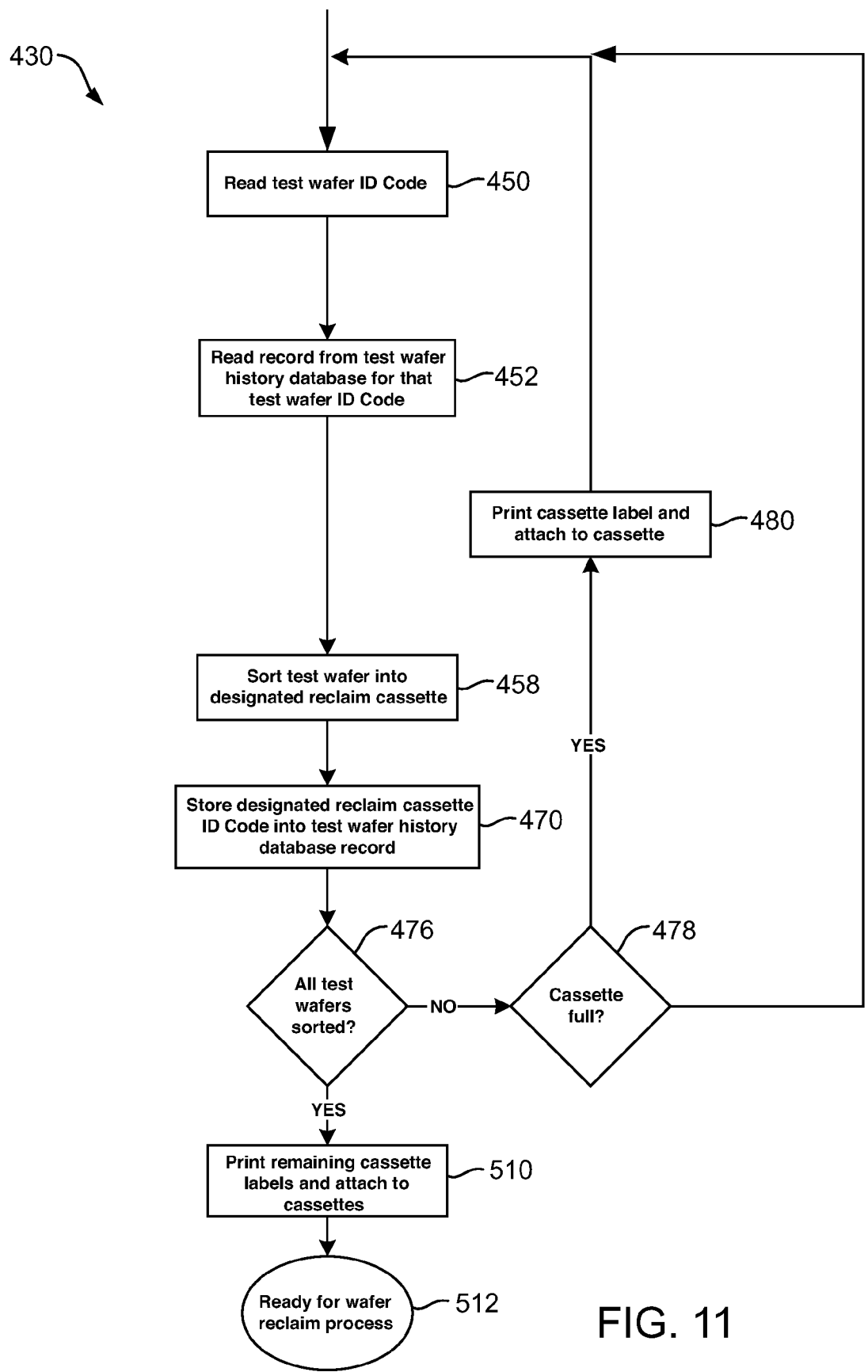
FIG. 11 is a flowchart representing an example of operations of a process of sorting test substrates by reclaim category.

FIG. 11 shows in greater detail an example of operations 430 which may be performed to physically sort (block 160, FIG. 2) and segregate test substrates into categories using the reclamation methods identified and stored into the test history database 150 illustrated in FIG. 4. The operations of FIG. 11 are preferably performed after one or more test substrates have been identified and inspected in a manner similar to that described above in connection with FIG. 7, the test substrate processing history and inspection database examined and the appropriate reclamation process has been stored in the database 150 for those test substrates in a manner similar to that described above in connection with FIG. 10. A test substrate may be identified, inspected and a reclamation process selected for that test substrate and the test substrate may be sorted and segregated before processing the next test substrate. Alternatively, test substrates may be identified and inspected a batch at a time, reclamation processes may be selected for each test substrate of the batch a batch at a time and the test substrates subsequently sorted and segregated a batch at a time.

To sort the test substrates for reclamation, a test substrate may be withdrawn from a cassette or other storage bin 118*a*, 118*b* . . . 118*n* by an appropriate robot 172 (FIG. 5) and the identification code on that test substrate may be read (block 450, FIG. 11) by a suitable reader 126. In some applications, the test substrate may also be inspected for crystal lattice defects at this time. Using the read identification code, the record 300*a*, 300*b* . . . 300*n* (FIG. 4) of the test substrate history database 150 is read (block 452) and the test substrate is sorted by the robot 172 by placing (block 470) the test substrate into the appropriate reclaim cassette 118*a* . . . 118*n* or other storage bin. In one embodiment, each cassette 118*a* . . . 118*n* may be associated with one particular type of reclamation process including one particular type of crystal lattice defect or metallic contaminant reduction treatment.

Thus, for example, one cassette may be used for storing test substrates having COP defects and which will undergo a suitable anneal treatment for such COP defects. Another cassette may be used for storing test substrates having OISF defects and which will undergo a suitable anneal treatment for such OISF defects. Another cassette may container test substrates, which require a defect treatment for substrates having a combination of defects and so on. In the illustrated embodiment, the identification code of the reclamation process intended for each cassette is stored in a field 464 (FIG. 3) of the cassette database record 210*a* . . . 210*n* associated with that particular cassette.

To identify the appropriate destination cassette 18*a* . . . 118*n* for a test substrate being handled by the robot 172, the identification code of the reclamation process selected for that test substrate is read from the field 392 of the test history database record for that test substrate and the identification code for the cassette which has been selected for that reclamation process is read from the cassette database 120. The robot 172 places the test substrate into an open slot of the cassette identified for that reclamation process. The identification code of the destination cassette into which the test substrate was placed may also be stored (block 470) in a field 472 of the test history database record 300*a* . . . 300*n* for that particular test substrate. Similarly, data identifying which cassette and which slot number of that cassette that the test substrate was placed may be stored into the cassette database 120. For example, the identification code of that test substrate may be stored in the appropriate record of the cassette database 120 for the destination cassette, in the appropriate test substrate identification code field 262 for the slot number field 264 of the slot of the destination cassette into which the test substrate was stored.

After placing the test substrate into the destination cassette 118*a* . . . 118*n*, an inquiry (block 476) may be made to determine if all of the test substrates destined for reclamation have been sorted. If not, an inquiry (block 478) may be made as to whether the last destination cassette is full of sorted test substrates. If so, the data in the database 120 for that cassette may be "date stamped" by storing the date the test substrate and reclamation data was stored into the database 120 for that cassette in a field 479.

In addition, a label may be printed (block 480) and attached to that cassette. FIG. 12 shows an example of such a cassette label 500. The cassette label 500 is preferably computer generated but may be generated in any suitable manner. The system 100 can print the label 500 such that the label 500 can include a variety of useful information. For example, the label 500 of FIG. 12 identifies the cassette identification code in a portion 502 and the reclamation process selected for each of the test substrates stored in the cassette is identified in a portion 504. The reclamation process may be identified by a description title or an identification code or both and could also include a description of the steps of the reclamation process. Other information which may be printed on the label 500 in a portion generally at 506 includes the date the test substrates were placed into the cassette, an identification of the owner of the test substrates or other customer information, an identification of the company which sorted the test substrates and an identification of the supplier intended to perform the reclamation process on the test substrates in the cassette. Still further, a list of all of the test substrates stored in the cassette may be listed on the face of the label 500 in another portion 508. This list may include the identification code of each test substrate and the slot number in which the test substrate is stored.

If all the test substrates have not been sorted, the robotic handling system can identify (block 450) another test substrate, sort it by reclamation process and place (blocks 452-470) it into the appropriate cassette for its reclamation process. Once all of the test substrates have been sorted (block 476), cassette labels may be printed (block 510) for all the remaining cassettes, which have not yet been labeled in a manner similar to that described in FIG. 12 above. The cassettes containing the sorted test substrates and bearing the cassette labels are ready (block 512) to be processed in accordance with the reclamation process identified on each cassette label.

FIG. 13 illustrates generally at 590 an example of operations, which may be performed by the reclamation operator. In accordance with additional aspects, prior to actually performing the reclamation processes on the test substrates, a verification process (block 600) may be performed on the test substrates by the reclamation operator as indicated in FIG. 13. This verification may include verifying the test substrate identification codes, cassette identification codes and reclamation process identification codes as explained in greater detail in FIG. 15 discussed below.

Following verification, an additional identification code may be optionally inscribed (block 602) on each test substrate using some or all of the test history database 150. The information from the database 150 may be transmitted to the reclamation operator by a network connection, portable or removable media such as floppy disks or optical media or the Internet, for example. FIG. 16 shows an example of a test substrate 130 having a first identification code 240, which is typically inscribed by the substrate manufacturer. Using the test substrate history database, a second identification code 610 may be inscribed on the test substrate by the reclamation operator, for example. The second identification code, an example of which is illustrated in FIG. 17 could include a variety of alphanumeric characters and other symbols which are visible to the human eye or readable by machine vision or both. For example, the additional identification code could include identification symbols 612 of the reclamation process to which the test substrate is to be subjected such as a COP treatment, a BMD treatment, a combination COP/OISF treatment, etc.

The second identification code 610 could also include a field 614 of symbols identifying the reclamation processor, a field 616 of symbols identifying the date the second identification code 610 was added or the date the reclamation process was performed, and a field 618 of symbols uniquely identifying the test substrate. The field 618 may be the same as the code 240 inscribed by the substrate manufacturer or a new test substrate identification code generated by the reclamation processor.

Following verification (block 600) of the substrate identity and the reclamation process and following inscribing (block 602) a second identification code, the test substrate may be reclaimed (block 630) in accordance with the reclamation process identified for that particular test substrate. As previously mentioned, the reclamation process may be selected in a manner, based upon the recorded processing history of the particular test substrate, which not only can increase the efficiency of the reclamation process but also reduce unnecessary thinning of the reclaimed test substrates.

Figure 15:
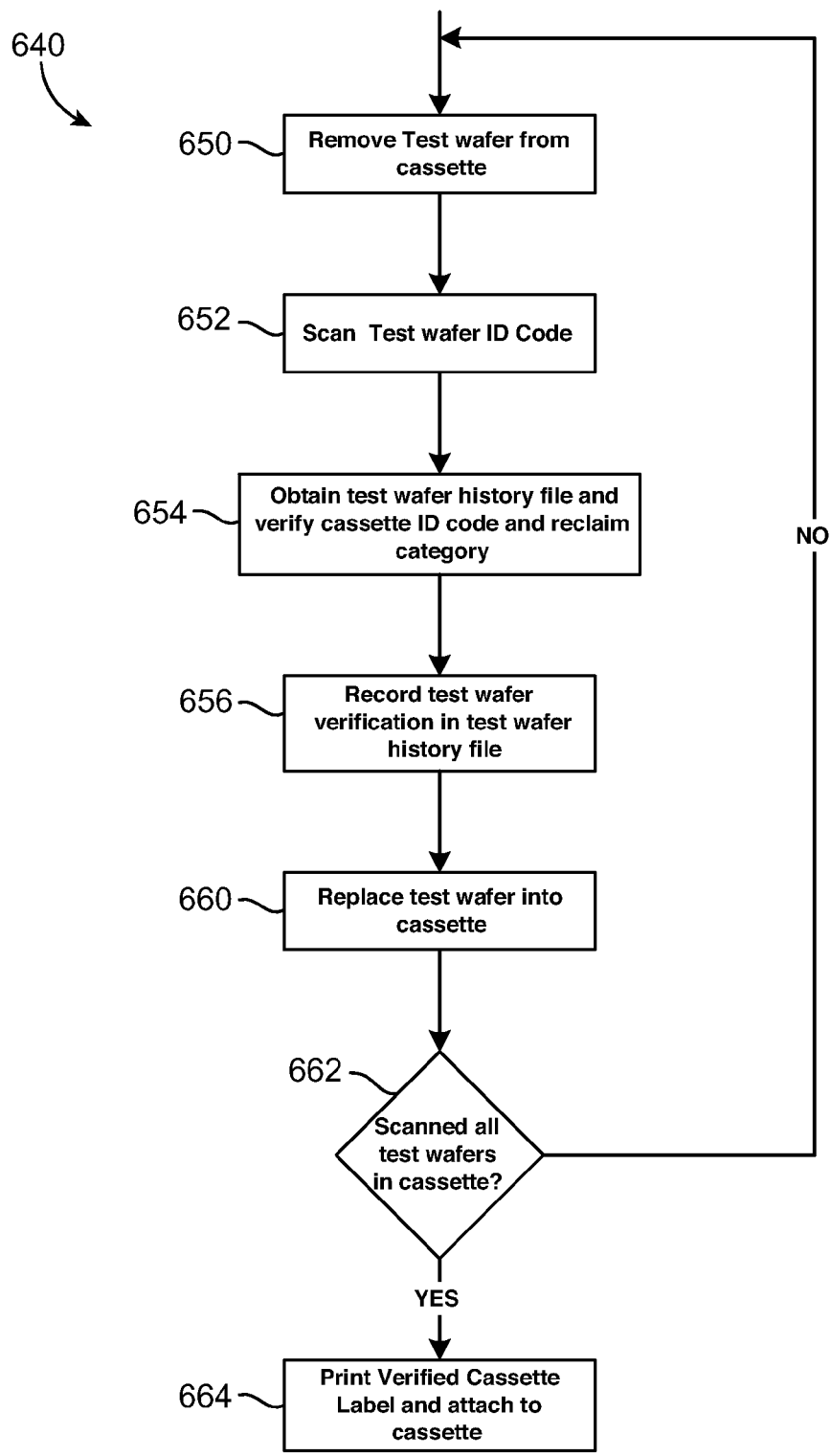
FIG. 15 is a flow chart representing an example of operations by a reclaim supplier to verify test substrate ID's, cassette ID's and reclaim categories.

FIG. 15 shows examples of operations 640 which may be performed by the reclamation operator to verify the identity of each test substrate prior to reclaiming the test substrate. As previously mentioned, the test substrates may be stored in cassettes such as the cassettes 118a . . . 118n in which the test substrates have been sorted by reclamation process type. The reclamation operator may have a computerized system similar to the system 100 illustrated in FIG. 1. To verify that the test substrates have been properly sorted and assigned to the proper reclamation process, the robot 172 removes (block 650) a test substrate from the cassette 118a . . . 118n, a scanner 126 scans (block 652) the test substrate to read the test substrate identification codes inscribed or otherwise placed on the test substrate. Using the test substrate identification code, relevant portions of the test history database 150 transmitted to the reclamation operator may be looked up for that test substrate identification code (field 306, FIG. 4) to obtain the reclamation process (field 392) and cassette (field 472) assigned to that test substrate. The test substrate identification code, reclamation process and cassette identification code of the test substrate may be compared (block 654) to the corresponding information printed on the label 182a . . . 182n attached to the cassette from which the test substrate is withdrawn to confirm that the test substrate was sent to the reclamation operator in the proper cassette with the proper reclamation process identified for that cassette and test substrate. In addition, this information may be compared to that contained in any printed reports such as the substrate ID report (FIG. 8) which may have accompanied the cassettes of test substrates to the reclamation operator.

In some embodiments, it may be desirable to record (block 656) in a database such as the test history database 150 or the cassette database 120 FIG. 3 transmitted to the reclamation processor that it was confirmed that the test substrate was sent to the reclamation operator in the proper cassette with the proper reclamation process identified for that cassette and test substrate. After replacing (block 660) the test substrate, another test substrate may be removed from the cassette and verified as discussed above. Once all (block 662) the test substrates in a cassette have been verified, another label may be printed (block 664) and attached to the cassette indicating that the identifies of the test substrates and the intended reclamation process type have been verified for each test substrate in the cassette. Alternatively, the label such as the label 500 attached to the cassette as shipped to the reclamation operator may be marked to indicate the verification. The remaining cassettes may be verified as described above in connection with FIG. 15.

Following verification, additional identification codes may be inscribed on the cassettes as described above. The test substrates of each verified cassette may then be reclaimed in a manner specified by the label 500 of the cassette or a report accompanying the test substrates. Various reclamation steps are well known to those skilled in the art. In addition, tools for performing reclamation steps are well know those skilled in the art. For example, polishing steps may be performed by an Applied Materials Reflexion tool and cleaning steps may be performed by an Applied Materials Oasis tool. Other tools by Applied Materials, Inc. and other manufacturers for other reclamation processes are known to those skilled in the art as well.

Figure 18:
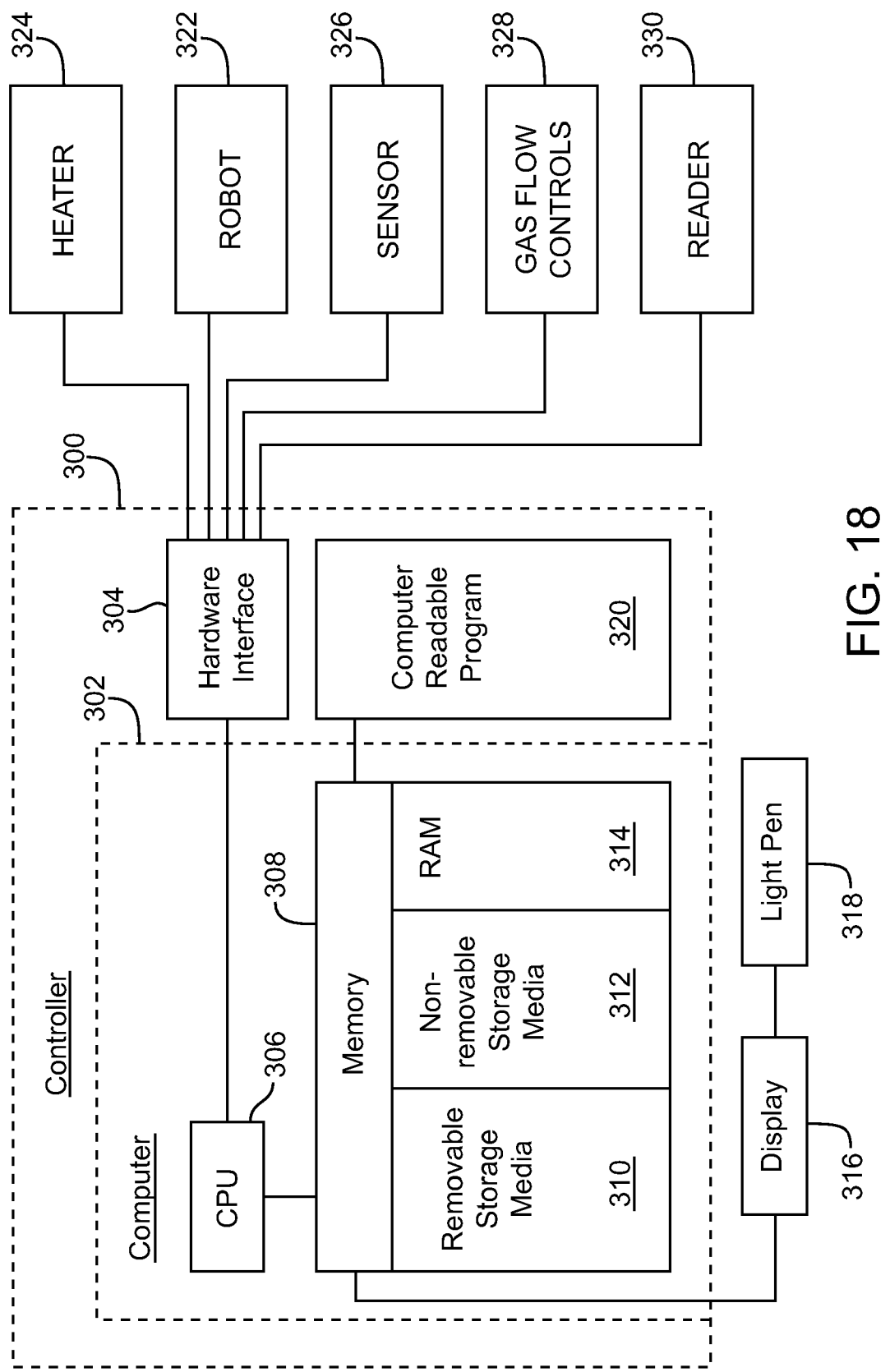
FIG. 18 is a block diagram of a controller suitable for the present system.

The described techniques for reclaiming test substrates and preparing test substrates for reclamation may be implemented as a method, apparatus or article of manufacture using standard programming and/or engineering to produce software, firmware, hardware, or any combination thereof. An exemplary embodiment of a controller 300 capable of controlling the sorting, reclaiming, and inspecting processes is shown in FIG. 18. The controller 300 includes a computer comprising a central processor unit (CPU) 306, such as for example a Pentium Processor from Intel Corporation, Santa Clara, Calif., that is coupled to a memory 308 and peripheral computer components. The memory 308 may include a removable storage media 310, such as a CD or floppy drive, a non-removable storage media 312, such as hard drive, and random access memory 314. The controller 300 may further comprise a plurality of interface cards including analog and digital input and output boards, interface boards, and motor controller boards. The interface between an operator and the controller 300 can be via a display 316 and a light pen 318. The light pen 318 detects light emitted by the monitor display 316 with a light sensor in the tip of the light pen 318. To select a particular screen or function, the operator touches a designated area of a screen on the monitor 316 and pushes the button on the light pen 318. Typically, the area touched changes color, or a new menu is displayed, confirming communication between the user and the controller 300.

In one version, the controller 300 comprises a computer-readable code 320 and associated databases stored in the memory 308, for example on the non-removable storage media 312 or on the removable storage media 310. The computer readable code 320 generally comprises process control code to operate the robot 322 to transfer substrates from a furnace or microwave chamber to cassettes, a heater 324 which is used to heat the substrates and can be an electrical resistance heater or a microwave heater, a sensor 326 to detect or inspect the substrates to determine defect and metallic contaminant types and surface concentration levels, gas flow controls 328 to maintain a pressure of gas in the substrate treatment chamber, and a reader 330 to read or place identification information on the substrates and cassettes. The computer-readable code 320 may be written in any conventional computer-readable programming language, such as for example, assembly language, C++, or Fortran. Suitable program code is entered into a single file, or multiple files, using a conventional text editor and stored or embodied in computer-usable medium of the memory 308. If the entered code text is in a high level language, the code is compiled, and the resultant compiler code is then linked with an object code of precompiled library routines. To execute the linked, compiled object code, the user invokes the object code, causing the CPU 306 to read and execute the code to perform the tasks identified in the program.

The computer-readable code stored in the controller 300 includes, for example, program code to obtain from the database, for each read test substrate, stored test substrate data describing each read test substrate and to assign to each read test substrate, a crystal lattice defect reduction treatment associated with the stored test substrate data for the read test substrate. In addition, program code can also be provided to obtain from the database, for each read test substrate, stored test substrate data describing each read test substrate and to assign to each read test substrate, an associated metal-contaminant reduction treatment, or even an associated copper reduction treatment.

The term "article of manufacture" as used herein refers to code or logic implemented in hardware logic (e.g., an integrated circuit chip, Programmable Gate Array (PGA), Application Specific Integrated Circuit (ASIC), etc.) or a computer readable medium, such as magnetic storage medium (e.g., hard disk drives, floppy disks, tape, etc.), optical storage (CD-ROMs, optical disks, etc.), volatile and non-volatile memory devices (e.g., EEPROMs, ROMs, PROMs, RAMs, DRAMs, SRAMs, firmware, programmable logic, etc.). Code in the computer readable medium is accessed and executed by the controller 300. The program code in which preferred embodiments are implemented may further be accessible through a transmission media or from a file server over a network. In such cases, the article of manufacture in which the code is implemented may comprise a transmission media, such as a network transmission line, wireless transmission media, signals propagating through space, radio waves, infrared signals, etc. Thus, the "article of manufacture" may comprise the medium in which the code is embodied. Additionally, the "article of manufacture" may comprise a combination of hardware and software components in which the code is embodied, processed, and executed. Of course, those skilled in the art will recognize that many modifications may be made to this configuration without departing from the scope of the present invention, and that the article of manufacture may comprise any information bearing medium known in the art.

In the described implementations, certain aspects of the reclamation preparation and processing are included in a computer to direct handling of the test substrates. In alternative implementations, the reclamation preparation and processing implementations may be implemented using any type of electronic device communicating with other devices, such as a hand held computer, a palm top computer, a laptop computer, a network switch or router, a telephony device, a network appliance, a wireless device, etc.

FIGS. 3, 4, 8, and 14 illustrate certain information maintained in databases stored in computer memory. In alternative implementations, additional or different types of information may be maintained. The illustrated operations of FIGS. 2, 7, 9, 10, 11, 13, and 15 show certain events occurring in a certain order. In alternative embodiments, certain operations may be performed in a different order, modified or removed. Moreover, steps may be added to the above described logic and still conform to the described embodiments. Further, operations described herein may occur sequentially or certain operations may be processed in parallel. Yet further, operations may be performed by a single processing unit or by distributed processing units. Operations described as being performed by a fabricator may also be performed by a reclamation operator. Conversely, operations described as being performed by a reclamation operator may be performed by a fabricator.

There are various known crystal lattice defects, which may appear at the surface of a substrate. These defects include crystal-originated particles (COP) at the substrate surface, bulk micro-defect (BMD) density at the substrate surface, and oxidation-induced stacking faults (OISF). These defects may appear in various patterns including ring shaped patterns often referred to as "ring mark", disk shaped patterns often referred to as "red sun" or a COP pattern. It is believed that ring-like and disk-like distributed defect patterns originate from silicon crystal ingot growth and may be enhanced from a high temperature anneal process undergone in the fabrication facility.

Table I below sets forth several examples of crystal lattice defect reduction treatments which are believed to reduce or shrink the defects, as a function of the type or combinations of types of defects and defect patterns believed present adjacent the substrate surface. These treatments include a basic anneal heat treatment which may or may not include one or more assist gasses to facilitate removal of the defects. The anneal temperature may be substantially constant or may be ramped up in a controlled fashion. Moreover, the cooling may be controlled so that the temperature ramps downward in a controlled fashion. A maximum duration of the treatment may also be provided. Substrates may also be treated in batches. The spacing of the substrates, either vertical or horizontal spacing, may also be provided. Parameters may be selected to minimize or reduce slip band generation.

TABLE I

| Defect(s) | Max Temp. | Temperature Rate (° C./min) | Assist Chemicals | Cooling Rate (° C./min) | Duration (secs) | Batch substrate |
|---|---|---|---|---|---|---|
| COP | 900 | 15 | N2, Ar or H | 20 | 30 min | 25-50 per load |
| BMD | 950 | 15 | Same | 20 | 30 | Same |
| OISF | 1050 | 15 | Same | 20 | 30 | Same |
| COP and BMD | 950 | 15 | Same | 20 | 30 | Same |
| COP and OISF | 1050 | 15 | Same | 20 | 30 | Same |
| BMD and OISF | 1050 | 15 | Same | 20 | 30 | Same |
| COP, BMD and OSIF | 1050 | 15 | Same | 20 | 30 | Same |

In another aspect of the present invention, the substrate identification process is used to substrates contaminated with metallic contaminants are segregated from other substrates. Each read test substrate is then assigned a metallic contaminant reduction treatment as a function of the stored test substrate data for each read test substrate. The read plurality of test substrates can also be sorted into a plurality of groups, wherein each test substrate of a group has a common assigned metallic contaminant reduction treatment. These processes are conducted in the same way as for the lattice defect identification processes described above.

Each read test substrate of a group has a common identified metallic contaminant and/or contaminant level, for example, the common identified metallic contaminant can be copper, or can be specified as copper with a detectable surface contamination level of greater than 10 ppb. The stored test substrate data can also include data identifying fabrication-processing steps undergone by a read test substrate including deposition and anneal treatments. Accordingly, the read plurality of test substrates is sorted into a plurality of groups, each group of test substrates having associated therewith (i) a common identified processing step, and (ii) a common assigned metallic contaminant or minimum metal contamination level. Each group of read test substrate having common levels or types of contaminants can be stored in a cassette and the cassette labeled with indicia representing the metallic contaminant reduction treatment associated with the group.

The read test substrates can also be inspected to identify a metallic contaminant level of the test substrate and test substrate data describing the results of the defect inspection for the substrate are stored in the database. In the inspection process, pluralities of substrates are tested to detect the type or concentration level of the metallic contaminants on the surface. For example, substrates with particular metallic contaminant levels, for example, greater than 10 parts per billion (ppb) can be determined to high levels of contamination and separated from the other substrates to remove the metallic contaminants. Advantageously, substrates with these high-levels of metallic contaminants are reclaimed separately from other substrates to prevent contamination of other lower level or uncontaminated substrates with the metallic contaminants extracted from the highly contaminated substrates.

The metallic contaminant levels of selected substrates can be detected by conventional measurement techniques, such as by scanning electron microscope methods or Auger spectroscopy. The metallic contaminant level on each substrate can also be detected using elemental analytical techniques used for the measurement of trace components, such as ICP-MS (inductively coupled plasma mass spectrometry), ICP-OES (inductively coupled plasma optical emission spectrometry), and GFAAS (graphite furnace atomic absorption spectroscopy).

ICP-MS is a preferred testing method because of its sensitivity and multi-element capability. In the ICP-MS method, a plasma or gas consisting of ions, electrons and neutral particles is formed from argon. The plasma is used to atomize and ionize the elements found in the surface of a substrate. The resulting ions are then passed through a series of aperture cones into the high vacuum mass analyzer, which identifies the isotopes of the elements, by their mass-to-charge ratio (m/e) and the intensity of a specific peak in the mass spectrum, which is proportional to the amount of that isotope (element) in the original sample. A suitable ICP-MS apparatus is the 7500 Series from Agilent Tech. Inc., Palo Alto, Calif.

The substrates determined to contain sufficiently high levels of metallic contaminants are separated from the other substrates for processing in apparatuses, which are dedicated or specially marked for processing metallic contaminants. Each metallic contaminant can have its own reclaiming processing apparatus line, or a number of different metallic contaminants may be reclaimed in the same apparatus line when cross-contamination of metallic contaminants does not affect subsequent removal steps. The segregation of particular metallic contaminant reclaiming lines, such as, for example, copper and non-copper reclaiming lines, is used to avoid cross contamination. Even with the segregation of the copper-containing substrates, care must be observed to avoid substrate-to-substrate contact to reduce the likelihood of the cross-contamination of substrates in a batch.

The substrates suspected of containing metallic contaminants but which are undetectable can also be heated and quenched to aid detection of the metallic contaminants. Metallic contaminants such as copper impurities, which are typically deposited or fall on the surface of the substrate often end up penetrating deep into the bulk of the substrate during subsequent processing steps or cleaning steps performed on the substrate. When the substrate is a silicon substrate, the bulk silicon often contains unacceptably high levels of copper when the surface contains only trace levels of copper, which are virtually undetectable. Copper has a particularly low diffusion coefficient in silicon of $1 \times 10^{-4}$ cm$^2$/sec, and diffuses quickly in silicon even at low temperatures, resulting in device failures. The copper diffusion can even occur at room temperatures, thus, after a few months in storage the copper in the bulk silicon diffuses out to the surface to contaminate the manufactured devices.

Furthermore, even if the surface metallic contaminant levels are detectable, the substrates can be heated to diffuse metal species to the surface from the bulk substrate underlying the surface to further increase the surface concentration of the species to facilitate their removal. For example, the copper contamination in the bulk of the silicon substrate can be detected and increased by heating prior to shipping a lot of substrates for reclaiming or even in the substrate fabrication line.

In one embodiment of a reclaiming process, substrates comprising metallic contaminants, such as copper-containing materials, are detected and removed from the batch of other substrates for copper removal. The copper-containing impurities can include elemental copper or copper compounds. The copper impurity containing substrates are heated to provide energy to the copper species in the substrate to causing the copper species to diffuse from the bulk to the surface of the substrate. In one method, the substrate is heated in a furnace, which can be an electrical resistance heated furnace or an induction heated furnace. In the furnace, a large number of substrates can be processed at the same time to increase efficiency, and handling and environmental conditions should be selected to avoid further contaminating the substrates. The substrate is heated to a temperature for a time that is sufficiently high to cause the metallic contaminant, such as copper-containing species, in surface of the substrate. In one version, the substrate is heated to a temperature of at least about 160° C., and more typically from about 240 to about 440° C. The temperature is maintained for a time period of at least about 50 seconds, and more typically from about 60 to about 220 seconds. After the heating step, the contaminants which are diffused to the surface of the substrate can now be detected using ICP-MS or other techniques, and the surface region with high levels of contamination can also be easily removed.

The heated substrate environment can also be controlled to provide the desired composition of the surface layer of the substrate. For example, when a silicon substrate is heated in an oxygen-containing environment, the surface layer of the silicon substrate converts to a silicon dioxide layer, which is more easily removed by chemical stripping processes. Thus, in one version, the substrate is heated in an oxygen-containing environment, such as air or oxygen gas. However, the silicon substrate can also be heated in and in that atmosphere, such as in argon atmosphere, so that the surface level remains a silicon layer. The metallic contaminants diffused to the surface become entrapped in the surface layer wherever its composition.

After the heating, the substrate is quenched, that is rapidly cooled, at a quench rate that is sufficiently high to obtain a higher surface concentration level of metallic contaminant than the original surface concentration level. It should be noted that both the time/temperature for which the substrates are heated, and the rate at which they are cooled are important to control the diffusivity of the metallic contaminants. Heating to a temperature, which is too low will result in little or no diffusion of metallic contaminants. Furthermore, if the substrate is not rapidly quenched or cooled, the metallic contaminant diffuses back from the surface into the bulk of the substrate. Thus, for example, the substrate is heated and rapidly quenched to achieve a second surface concentration level of the metallic contaminant that is higher than the first (original) surface concentration level. For example, a second surface concentration level can be achieved which is at least about 20% higher than the first surface concentration level, or even at least about 50% higher than the first surface concentration level. In one version, for example, which can be used when the detectable surface concentration is very low, the substrate is heated to a temperature and for a time, then rapidly quenched, to obtain a surface concentration level which is at least about 3 times higher than the original surface concentration level of the metallic contaminant. Typically, the first or original surface concentration level of the metallic contaminant such as copper in the surface is less than about 10 ppb. The substrate is heated and quenched to increase the surface copper concentration to at least about 50 ppb.

The substrate is rapidly quenched at an average quench rate that is the quench rate obtained over the cooling time period. For example, the average quench rate can be determined by the temperature to which, the substrate is heated minus the final cooled temperature, divided by the time in seconds. Since cooling rates are often non-linear, the average quench rate is a more accurate measure. In one version, the substrate is cooled from the temperature described above down to room temperature. For example, an average quench rate of at least about 3° C./sec is suitable, or preferably, at least about 5° C./sec. For example, when heating the substrate to a temperature of at least about 240° C., the substrate can be quenched from the temperature to room temperature in about 1 minute. In one method, the substrate is quenched by exposing the substrate to liquid nitrogen vapor.

In another version, the substrate is heated by applying microwave radiation to the substrate. The microwave radiation . . . . The microwave heat generator is generally cheaper to operate and set-up, and does not require special electrical power lines like the furnace. Also, because the microwave power is absorbed directly by the copper-containing impurity species, it can heat up the substrate in a shorter time and more efficiently use electrical power. The copper species are directly excited by the microwave energy rather than through conductive heat transfer. The microwave power is preferably applied at a power level of at least about 500 Watts, and more typically from about 1000 to about 2000 Watts, or even about 1500 Watts. The microwave power is applied for a time period of at least about 40 seconds, and more typically from about 95 to about 135 seconds.

The effect of heating by microwave power on the copper surface concentration of two substrates, as measured by ICP-MS methods, is shown in Table II. In this experiment, a copper contaminated substrate an 8" diameter silicon substrate was contaminated with copper in the bulk of the silicon substrate. The second substrate was a 6" diameter silicon substrate, which was not contaminated with copper. Initially, after 30 seconds of heat treatment with microwave energy, both substrates had a low surface concentration of copper as measured by ICP-MS. The contaminated substrate had about 1.1 parts per billion of copper at the surface and the uncontaminated substrate had about 0.123 parts per billion of copper at its surface. However, after 60 seconds of heat treatment with microwave energy at 1550 Watts, the contaminated substrate had a high surface concentration of copper at about 233 parts per billion of copper at the surface, and the uncontaminated substrate was not significantly changed at 0.095 parts per billion of copper at its surface. Thus, in the contaminated substrate, the surface concentration of copper increased 200 times after 60 seconds of heat treatment with microwave energy. This significant increase in surface concentration, allowed the contaminant copper to be easily removed from the substrate by removal of the surface layer with a high copper concentration. It also allowed much easier detection of the copper contamination within the substrate using the ICP-MS method.

After the heating and quenching process steps which result in metallic contaminant species entrapped in the substrate surface, to rise to the substrate surface the metallic contaminants are removed from the substrate surface using one or more different removal methods. In one removal process, the surface of the substrate can be ground and polished off by convention of chemical mechanical polishing (CMP). A typical CMP apparatus comprises a polishing head that oscillates and presses a substrate against a polishing pad while an abrasive particle slurry is supplied therebetween according to a selected slurry recipe. The polishing pad typically has multiple layers made of polymers, such as polyurethane, and may include a filler for added dimensional stability, and an outer resilient layer. Polishing pads for oxide polishing are typically relatively hard and incompressible pads, and have surface grooves to facilitate distribution of the slurry solution and entrap particles. The polishing pad is usually sized to be at least several times larger than the diameter of the substrate, and the substrate is kept off-center on the polishing pad to prevent polishing a non-planar surface onto the substrate. The polishing slurry can include, for example, deionized water with suspended abrasive particles such as colloidal silica, aluminum oxide, silicon carbide, or even diamond particles. Both the pad and substrate can be programmed to rotate at different rotational speeds and directions according to a process recipe, and are typically simultaneously rotated with their axes of rotation being parallel to one another, but not collinear, to prevent polishing a taper into the substrate.

The CMP process removes a surface layer of the substrate in a thickness that depends on the grinding slurry, polishing pad composition, polishing time, polishing pressure, and other such variables. It is believed that CMP polishing occurs as a result of both chemical and mechanical effects, for example, a chemically altered layer is repeatedly formed at the surface of the material being polished and then polished away. In the polishing of the silicon substrate heated in an oxygen-containing environment, the surface layer of silicon oxide contaminated with a metallic contaminant, such as copper, is removed by the CMP process. Typically, the thickness of about 2 to about 20 microns, and more typically about 10 microns, of the substrate is removed.

Another surface removal process uses a chemical stripping solution to remove the surface layer of the substrate having the higher concentration of metallic contaminant. The chemical stripping solution can be composed of acids or bases, which are selected to dissolve the surface layer. Typically, when a substrate comprising a silicon substrate is heated in an oxygen-containing environment, such as air, the surface layer transforms to a silicon dioxide layer. The metallic contaminants defused to the surface are thus entrapped within the surface silicon dioxide layer. For such layers, a suitable chemical stripping solution comprises HF (hydrofluoric acid) solution, comprising HF diluted in water, for example, a 30 to 40% concentration of HF. However, if the silicon substrate is heated in an inert atmosphere, the surface layer comprises in the elemental silicon with entrapped metallic contaminant, and such a layer can be removed by suitable acidic solutions.

In yet another version, a hydrogen-halogen gas is provided in the substrate environment while the substrate is still being heated. The hydrogen-halogen gas comprises hydrogen and halogen elements, in elemental or compound form, and is selected to chemically erode away the surface layer of the substrate containing the contaminants. For example, if the substrate surface comprises silicon contaminated with metallic contaminants such as copper, a hydrogen fluoride gas can be used to chemically react with the silicon to form silicon fluoride and metallic contaminant fluoride vapor, which can be removed from the substrate environment. The hydrogen-halogen gas is provided at a flow rate, and for a time, to effectively remove substantially the entire surface level comprising the metallic contaminants.

| | | Copper Contaminated Substrate | | | | Uncontaminated Substrate | | | |
|---|---|---|---|---|---|---|---|---|---|
| | | 8"-copper-30 sec | | 8"-copper-60 sec | | 6"-copper-30 sec | | 6"-copper-60 sec | |
| | M.W. | ppb (µg/L) | $10^{10}$ atoms/cm2 | ppb (µg/L) | $10^{10}$ atoms/cm2 | ppb (µg/L) | $10^{10}$ atoms/cm2 | ppb (µg/L) | $10^{10}$ atoms/cm2 |
| Na | 22.990 | 0634 | 1.585 | 4.934 | 12.338 | 0.201 | 0.894 | 0.237 | 1.054 |
| Mg | 24.305 | 0564 | 1.334 | 6.042 | 14.291 | 0.135 | 0.568 | 0.213 | 0.896 |
| Al | 26.982 | 1.231 | 2.623 | 1.642 | 3.498 | 1.383 | 5.238 | 1.445 | 5.473 |
| K | 39.000 | 0.186 | 0.274 | 0.450 | 0.663 | 0.114 | 0.299 | 0.226 | 0.592 |
| Ca | 40.078 | 0.394 | 0.56590 | 0.736 | 1.056 | 0.232 | 0.592 | 0.425 | 1.084 |
| De | 55.847 | 0.471 | 0.485 | 0.917 | 0.944 | 0.192 | 0.351 | 0.176 | 0.322 |
| Cu | 63.546 | 1.119 | 1.012 | 257.800 | 233.218 | 0.123 | 0.198 | 0.095 | 0.153 |
| Ni | 58.690 | 0.148 | 0.145 | 0.145 | 0.142 | 0.135 | 0.235 | 0.129 | 0.225 |
| Cr | 52.000 | 0.012 | 0.013 | 0.010 | 0.011 | 0.006 | 0.012 | 0.004 | 0.008 |
| Zn | 65.390 | 0.196 | 0.172 | 0.065 | 0.060 | 0.116 | 0.181 | 0.105 | 0.164 |
| Co | 59.000 | 0.000 | 0.000 | 0.000 | 0.000 | 0.000 | 0.000 | 0.000 | 0.000 |

In one example, a hydrogen-halogen gas comprising HCl gas, for example, anhydrous HCl gas is maintained at atmospheric pressure about the substrate. The anhydrous HCl gas reacts with silicon dioxide on the substrate surface to erode the surface to the desired depth. In one example, the hydrogen-halogen gas can be provided at a flow rate of from about 500 to about 5000 sccm/min, or for example, at about 3000 sccm/min. In this version, the substrate is maintained at a higher temperature, for example from about 200 to 500° C., and supported in a quartz furnace (SiO$_2$), for example, a tubular furnace which does not react with HCl.

The heating and subsequent removal of diffused out impurities from the surface of the substrate can also be repeated for a number of cycles until the metallic contaminants are no longer detected on the substrate surface. When this happens, the metallic contaminant concentration in the bulk of the substrate, for example the copper species concentration, has been lowered to a level sufficiently low that the residual contaminants do not affect subsequent device performance. The number of cycles depends on the concentration and penetration depth of copper species into the substrate and the heat treatment provided to the substrate. Typically, the number of operation cycles is sufficiently high to reduce the concentration of the substrate to less than about $1\times10^{10}$ atoms/cm$^2$. In one example, sequential heat treatment, quenching, and surface layer removal processes that make up a single process cycle, can be repeated for about 2 to about 10 cycles, or even for about 2 to about 5 cycles.

Although exemplary embodiments of the present invention are shown and described, those of ordinary skill in the art may devise other embodiments which incorporate the present invention, and which are also within the scope of the present invention. For example, other defect or contaminants can be isolated, inspected, or removed from substrates using the present methods. Also, substrates other than test substrates can be reclaimed by the present methods and apparatus, as would be apparent to those of ordinary skill in the art. Furthermore, the terms below, above, bottom, top, up, down, first and second and other relative or positional terms are shown with respect to the exemplary embodiments in the figures and are interchangeable. Therefore, the appended claims should not be limited to the descriptions of the preferred versions, materials, or spatial arrangements described herein to illustrate the invention.

What is claimed is:

1. A computer program product stored on a computer readable medium of a controller, the computer program product comprising computer-readable code executable to cause the controller to perform operations to reclaim test substrates used to test semiconductor fabrication tools, the operations comprising:
   (a) reading a plurality of test substrate identification data from a plurality of test substrates;
   (b) obtaining from a database, for each read test substrate, stored test substrate data describing the read test substrate; and
   (c) assigning each read test substrate a crystal lattice defect reduction treatment associated with the stored test substrate data for the read test substrate.

2. A product according to claim 1 wherein the operations further comprise inspecting each read test substrate to identify crystal lattice defects and storing in the database, test substrate data describing the results of the defect inspection for an inspected test substrate.

3. A product according to claim 1 wherein the operations further comprise sorting the read plurality of test substrates into a plurality of groups, wherein each test substrate of a group has a common assigned crystal lattice defect reduction treatment.

4. A product according to claim 3 wherein each read test substrate of a group has a common identified crystal lattice defect.

5. A product according to claim 3 wherein the operations further comprise reclaiming each read test substrate of each group using the common assigned crystal lattice defect reduction treatment.

6. A product according to claim 1 further wherein the stored test substrate data includes data identifying the section of an ingot from which the read test substrate was fabricated.

7. A product according to claim 6 wherein the crystal lattice defect reduction treatment assigned to each read test substrate depends upon the identified ingot section from which the read test substrate was fabricated.

8. A product according to claim 6 wherein the operations further comprise sorting the read plurality of test substrates into a plurality of groups, each group of test substrates having associated therewith a common identified ingot section and a common assigned crystal lattice defect reduction treatment.

9. A product according to claim 1 wherein the stored test substrate data includes data identifying fabrication processing steps undergone by a read test substrate including film deposition and anneal treatments.

10. A product according to claim 9 wherein the operations further comprise sorting the read plurality of test substrates into a plurality of groups, each group of test substrates having an associated common identified processing step and a common assigned crystal lattice defect reduction treatment.

11. A product according to claim 10 wherein the operations further comprise storing each group of read test substrate in a cassette and labeling the cassette of each group with indicia representing the common crystal lattice defect reduction treatment associated with the group.

12. A product according to claim 11 wherein the operations further comprise labeling the cassette of each group with indicia representing the test substrate identification data of each test substrate stored in the cassette of the group.

13. A product according to claim 1 wherein the operations further comprise implementing the crystal lattice defect reduction treatment on each test substrate.

14. A system to reclaim test substrates used to test semiconductor fabrication tools, the test substrates each bearing an identification code, the system comprising:
   (a) a reader to read an identification code from a test substrate; and
   (b) a controller having a memory to store a database comprising data representative of the identification code for each test substrate and associated data representative of a crystal lattice defect reduction treatment, and wherein the controller comprises program code to obtain from the database, for each read test substrate, stored test substrate data describing each read test substrate, and to assign to each read test substrate a crystal lattice defect reduction treatment associated with the stored test substrate data for the read test substrate.

15. A system according to claim 14 further comprising a robot to transfer a test substrate, and wherein the controller controls the robot to transfer a test substrate to a substrate storage container that has an associated crystal lattice defect reduction treatment.

16. A system according to claim 14 further comprising an in-line sensor to inspect each read test substrate to identify crystal lattice defects, and to store in the database, test substrate data describing the results of the defect inspection for an inspected test substrate.

17. A system according to claim 14 wherein the controller further comprises program code for implementing the crystal lattice defect reduction treatment in a substrate treatment chamber.

18. An article of manufacture for reclaiming test substrates used to test semiconductor fabrication tools, the article of manufacture comprising program code implemented in a computer readable medium of a controller, the program code executable to cause the controller to:
  (a) store in a database, a plurality of test substrate identification data, each test substrate identification data identifying a particular test substrate of a plurality of test substrates;
  (b) select a crystal lattice defect reduction treatment from a plurality of crystal lattice defect reduction treatments, for reclaiming each of said plurality of test substrates identified by said plurality of test substrate identification data; and
  (c) store into the database, a plurality of test substrate crystal lattice defect reduction treatment identification data associated with a stored test substrate identification data to identify the reclamation process selected to reclaim the test substrate.

19. An article according to claim 18 further comprising program code which is executable to cause the controller to implement the crystal lattice defect reduction treatment in a substrate treatment chamber.

20. A computer program product stored on a computer readable medium of a controller, the computer program product comprising computer-readable code executable to cause the controller to perform operations to reclaim the test substrates, and including a computer database of data for reclaiming test substrates used to test semiconductor fabrication tools, the computer database of data comprising:
  (a) a plurality of test substrate identification data, each test substrate identification data identifying a particular test substrate of a plurality of test substrates; and
  (b) a plurality of crystal lattice defect reduction treatment data, each crystal lattice defect reduction treatment data associated with a test substrate identification data.

21. A computer program product stored on a computer readable medium of a controller, the computer program product comprising computer-readable code executable to cause the controller to perform operations to reclaim test substrates used to test semiconductor fabrication tools, the operations comprising:
  (a) reading a plurality of test substrate identification data from a plurality of test substrates;
  (b) obtaining from a database, for each read test substrate, stored test substrate data describing each read test substrate; and
  (c) assigning each read test substrate a metallic contaminant reduction treatment associated with the stored test substrate data for each read test substrate.

22. A product according to claim 21 wherein the operations further comprise inspecting each read test substrate to identify a metallic contaminant level of the test substrate and storing in the database, test substrate data describing the results of the inspection for the substrate.

23. A product according to claim 21 wherein the operations further comprise sorting the read plurality of test substrates into a plurality of groups, wherein each test substrate of a group has a common assigned metallic contaminant reduction treatment.

24. A product according to claim 23 wherein each read test substrate of a group has a common identified metallic contaminant.

25. A product according to claim 24 wherein the common identified metallic contaminant is copper.

26. A product according to claim 21 wherein the stored test substrate data includes data identifying fabrication processing steps undergone by a read test substrate including deposition and anneal treatments.

27. A product according to claim 21 wherein the operations further comprise sorting the read plurality of test substrates into a plurality of groups, each group of test substrates having associated therewith (i) a common identified processing step, and (ii) a common assigned metallic contaminant or minimum contamination level.

28. A product according to claim 27 wherein the operations further comprise storing each group of read test substrate in a cassette and labeling the cassette of each group with indicia representing the metallic contaminant reduction treatment associated with the group.

29. A product according to claim 27 wherein the operations further comprise reclaiming each read test substrate of each group using the assigned metallic contaminant reduction treatment to reclaim each read test substrate of the group.

30. A product according to claim 21 wherein the operations further comprise implementing the metallic contaminant reduction treatment on each test substrate.

31. A computer program product stored on a computer readable medium of a controller, the computer program product comprising computer-readable code executable to cause the controller to perform operations to reclaim test substrates used to test copper fabrication tools, the operations comprising:
  (a) reading a plurality of test substrate identification data from a plurality of test substrates;
  (b) obtaining from a database, for each read test substrate, stored test substrate data describing each read test substrate; and
  (c) assigning each read test substrate, a copper contaminant reduction treatment associated with the stored test substrate data for each read test substrate.

32. A product according to claim 31 wherein the operations further comprise inspecting each read test substrate to identify the copper contaminant level of the test substrate and storing in the database, test substrate data describing the results of the inspection for the substrate.

33. A product according to claim 31 wherein the operations further comprise sorting the read plurality of test substrates unto a plurality of groups, wherein each test substrate of a group has a common assigned copper contaminant reduction treatment.

34. A system according to claim 31 wherein the operations further comprise implementing the copper contaminant reduction treatment in a substrate treatment chamber.

* * * * *